US010616497B2

United States Patent
Li et al.

(10) Patent No.: US 10,616,497 B2
(45) Date of Patent: Apr. 7, 2020

(54) METHOD AND APPARATUS FOR PROCESSING IMAGE SIGNAL CONVERSION, AND TERMINAL DEVICE

(71) Applicant: HUAWEI TECHNOLOGIES CO., LTD., Shenzhen, Guangdong (CN)

(72) Inventors: Meng Li, Beijing (CN); Hai Chen, Shenzhen (CN); Xiaozhen Zheng, Shenzhen (CN); Jianhua Zheng, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/986,149

(22) Filed: May 22, 2018

(65) Prior Publication Data

US 2018/0376047 A1 Dec. 27, 2018

Related U.S. Application Data

(63) Continuation of application No. PCT/CN2015/098503, filed on Dec. 23, 2015.

(51) Int. Cl.
*H04N 5/235* (2006.01)
*H04N 5/20* (2006.01)
(Continued)

(52) U.S. Cl.
CPC ........... *H04N 5/2355* (2013.01); *G06F 7/483* (2013.01); *G06T 5/007* (2013.01); *H03M 7/24* (2013.01);
(Continued)

(58) Field of Classification Search
CPC .... H04N 5/2355; H04N 19/186; G06F 7/483; G06T 5/007; G06T 2207/20208
See application file for complete search history.

(56) References Cited

U.S. PATENT DOCUMENTS

| 7,626,614 B1 | 12/2009 | Marcu |
| 2004/0036799 A1 | 2/2004 | Weitbruch et al. |

(Continued)

FOREIGN PATENT DOCUMENTS

| CN | 1487487 A | 4/2004 |
| CN | 101335894 A | 12/2008 |

(Continued)

OTHER PUBLICATIONS

Extended European Search Report issued in European Application No. 15911113.7 dated Sep. 7, 2018, 9 pages.
(Continued)

*Primary Examiner* — Ahmed A Berhan
(74) *Attorney, Agent, or Firm* — Fish & Richardson P.C.

(57) ABSTRACT

The present disclosure discloses a method and an apparatus for processing image signal conversion. In one example method, an input primary color signal is obtained. The primary color signal is a numeric value of an optical signal corresponding to an image. The primary color signal is proportional to light intensity. Conversion processing is performed on the primary color signal to obtain processed image information. The image information is a numeric expression value of the image. The conversion processing includes at least the following processing:

$$L' = a\left(\frac{pL}{(p-1)L+1}\right)^m + b,$$

where a, b, m, and p are rational numbers, L is the input primary color signal, and L' is the processed image information.

24 Claims, 7 Drawing Sheets

(51) Int. Cl.
*G06F 7/483* (2006.01)
*G06T 5/00* (2006.01)
*H03M 7/24* (2006.01)
*G09G 5/10* (2006.01)
*H04N 1/60* (2006.01)
*H04N 19/186* (2014.01)

(52) U.S. Cl.
CPC ............... *H04N 1/60* (2013.01); *H04N 5/20* (2013.01); *H04N 19/186* (2014.11); *G06T 2207/20208* (2013.01); *G09G 5/10* (2013.01); *H04N 1/6008* (2013.01)

(56) References Cited

U.S. PATENT DOCUMENTS

| | | | |
|---|---|---|---|
| 2005/0117799 | A1 | 6/2005 | Fun Chiou-Shann et al. |
| 2006/0017597 | A1 | 1/2006 | Jaspers |
| 2009/0003457 | A1 | 1/2009 | Liu et al. |
| 2012/0141029 | A1 | 6/2012 | Cha et al. |
| 2013/0148029 | A1* | 6/2013 | Gish ............ G09G 5/02 348/708 |
| 2014/0210847 | A1* | 7/2014 | Knibbeler ........ G09G 5/006 345/589 |
| 2014/0363093 | A1 | 12/2014 | Miller et al. |
| 2016/0005349 | A1 | 1/2016 | Atkins et al. |
| 2018/0233075 | A1 | 8/2018 | Boyd |

FOREIGN PATENT DOCUMENTS

| | | |
|---|---|---|
| CN | 102722868 A | 10/2012 |
| CN | 105009580 A | 10/2015 |
| EP | 1372340 A2 | 12/2003 |
| GB | 2408872 A | 6/2005 |
| GB | 2526047 A | 11/2015 |
| TW | I235608 B | 7/2005 |
| WO | 2014043005 A1 | 3/2014 |
| WO | 2014130343 A2 | 8/2014 |
| WO | 2014204865 A1 | 12/2014 |
| WO | 2015128603 A1 | 9/2015 |

OTHER PUBLICATIONS

Chinese Office Action issued in Chinese Application No. 201580085178.3 dated Mar. 14, 2019, 10 pages.
Report ITU-R BT.2246-5 the present state of ultra-high definition television, BT Series Broadcasting service television). Radiocommunication sector of ITU, Jul. 2015, 92 pages.
Christophe Schlick, Quantization Techniques for Visualization of High Dynamic Range Pictures. Proceedings of the 5th Eurographics Workshop on Rendering. Dec. 31, 1994, 13 pages.
Recommendation ITU-R BT.1886, Reference electro-optical transfer function for flat panel displays used in HDTV studio production. BT Series Broadcasting service(television). Radiocommunication sector of ITU, Mar. 2011, 7 pages.
Ajay Luthra et al, Call for Evidence (CfE) for HDR and WCG Video Coding. International Organisation for Standardisation Organisation Internationale De Normalisation ISO/IEC JTC1/SC29/WG11 Boding of Moving Pictures and Audio. ISO/IEC JTC1/SC29/WG11 MPEG2014/N15083, Feb. 2015, Geneva, Switzerland, 46 pages.
International Search Report issued in International Application No. PCT/CN2015/098503 dated May 27, 2016, 14 pages.

* cited by examiner

CONT.
FROM
FIG. 2A

CONT.
FROM
FIG. 2A

S207. Decode the encoded image information, to obtain decoded image information

S208. Perform upsampling on the decoded image information, to obtain image information generated after upsampling S209. Perform fixed-point-to-floating-point conversion on the image information generated after upsampling, to obtain image information generated after fixed-point-to-floating-point conversion S210. Transfer, from the YCbCr space to the RGB space by using a preset second color space transfer function, the image information generated after fixed-point-to-floating-point conversion, to obtain image information generated after space transfer S211. Perform, by using a preset electro-optical transfer function, electro-optical transfer on the image information generated after space transfer, to obtain an output primary color signal S212. Output the primary color signal

FIG. 2B

METHOD AND APPARATUS FOR PROCESSING IMAGE SIGNAL CONVERSION, AND TERMINAL DEVICE

CROSS-REFERENCE TO RELATED APPLICATIONS

This application is a continuation of International Application No. PCT/CN2015/098503, filed on Dec. 23, 2015, the disclosure of which is hereby incorporated by reference in its entirety.

TECHNICAL FIELD

The present disclosure relates to the field of image processing technologies, and in particular, to a method and an apparatus for processing image signal conversion, and a terminal device.

BACKGROUND

In a digital image, a dynamic range is a ratio of a maximum grayscale value to a minimum grayscale value in a range in which the image can be displayed. For a natural scene in a real world, if brightness is in a range of $10^{-3}$ nits to $10^4$ nits, a dynamic range of the real world may reach $10^7$, and is referred to as a high dynamic range (HDR). Currently, in most color digital images, each of R, G, and B channels separately uses one 8-bit byte for storage. In other words, a representation range of each channel is a 0-255 gray scale. That is, a dynamic range of a color digital image is 0-255, and is referred to as a low dynamic range (LDR). An imaging process of a digital camera is actually mapping from the high dynamic range of the real world to the low dynamic range of the image.

A typical HDR video processing process includes: preprocessing, encoding, decoding, and post-processing. An HDR video is input, and undergoes processing performed by an optical-electro transfer function, color space transfer, floating-point-to-fixed-point conversion, 4:4:4-to-4:2:0 downsampling, and encoding performed by a 4:2:0 encoder, and a bitstream is obtained. The bitstream undergoes decoding performed by a 4:2:0 decoder, 4:2:0-to-4:4:4 upsampling, fixed-point-to-floating-point conversion, color space transfer, and processing performed by an electro-optical transfer function, and a finally output HDR video is obtained. A transfer function is used to perform non-linear transfer on an HDR source. The HDR video finally needs to be quantized to data that has an integral quantity of bits, and then is encoded. Considering that a dynamic range of the HDR video is far greater than a dynamic range of the data that has an integral quantity of bits, if linear quantization is directly performed, information of the HDR source is severely damaged. Therefore, the transfer function is mainly used to protect, through the non-linear transfer, a brightness segment that requires key protection.

A Weber score is a main indicator used to measure quantization quality of a curve. A brightness value in each interval is obtained by using the optical-electro transfer function. A smaller Weber score that is obtained through calculation after a brightness value curve in each interval is quantized indicates higher quantization quality of this brightness. If an obtained Weber score is greater than a limit value, stripe noise that a human eye can perceive appears. A primary color signal is an optical signal in the real world, may be represented by "L" or "E", usually records a numeric value that is corresponding to a specific color component (for example, R, G, B, or Y), and is generally proportional to light intensity. A primary color signal of the image may be expressed in real brightness (for example, 10000 nits), or may be expressed in normalized brightness, for example, based on that maximum brightness 10000 nits is normalized to maximum brightness 1. Processed image information obtained after the primary color signal undergoes conversion processing is a numeric expression value of the image, and a value of the processed image information is normalized to [0,1]. The processed image information may be represented by "L'" or "E'", which is usually used to represent a non-linear color value. Optical-electro transfer is performed on the primary color signal (normalized to [0,1]) by using the optical-electro transfer function, to obtain processed image information. The processed image information obtained through the transfer performed by the optical-electro transfer function may include primary colors such as R, G, B, and Y. Electro-optical transfer is performed on input image information by using the electro-optical transfer function, to obtain an output primary color signal. The processed output primary color signal is a restored optical signal in the real world. The optical-electro transfer function (OETF) is sometimes referred to as an optical-electro transfer function or an optical-electro transfer curve. The electro-optical transfer function (EOTF) is sometimes referred to as an electro-optical transfer function or an electro-optical transfer curve. The floating-point-to-fixed-point conversion is sometimes referred to as quantization, and the fixed-point-to-floating-point conversion is sometimes referred to as dequantization. An optical-electro transfer function in conventional scheme 1 is proposed based on a brightness perception model of a human eye. The optical-electro transfer function may be:

$$R' = \text{PQ\_TF}(\max(0, \min(R/10000,1)))$$

$$G' = \text{PQ\_TF}(\max(0, \min(G/10000,1)))$$

$$B' = \text{PQ\_TF}(\max(0, \min(B/10000,1)))$$

$$\text{PQ\_TF}(L) = \left(\frac{c_1 + c_2 L^{m_1}}{1 + c_3 L^{m_1}}\right)^{m_2},$$

where $m_1 = 0.1593017578125$, $m_2 = 78.84375$, $c_1 = 0.8359375$, $c_2 = 18.8515625$, and $c_3 = 18.6875$.

A Weber score is a main indicator used to measure quantization quality of a curve. A Weber score shown in FIG. 1A is used as an example. A first curve is a Schreiber threshold in an ITU Report BT.2246 standard file. A brightness value in each interval is obtained by using the optical-electro transfer function. A smaller Weber score that is obtained through calculation after a brightness value curve in each interval is quantized indicates higher quantization quality of this brightness. If an obtained Weber score is greater than the Schreiber threshold, stripe noise that a human eye can perceive appears. A second curve includes Weber scores obtained by using the optical-electro transfer function in scheme 1. Weber scores of the second curve, that are obtained when a brightness value is less than 0.1 nits exceed the Schreiber threshold. As a result, an output HDR image generates stripe noise that a human eye can perceive, and cannot meet a quality requirement.

SUMMARY

This application provides a method and an apparatus for processing image signal conversion, and a terminal device, so as to improve quantization quality.

According to a first aspect, a method for processing image signal conversion is provided. The method includes:

obtaining an input primary color signal, where the primary color signal is a numeric value of an optical signal corresponding to an image, and the primary color signal is proportional to light intensity; and performing conversion processing on the primary color signal, to obtain processed image information, where the image information is a numeric expression value of the image, and the conversion processing includes at least the following processing:

$$L' = a\left(\frac{pL}{(p-1)L+1}\right)^m + b,$$

where a, b, m, and p are rational numbers, L is the input primary color signal, and L' is the image information generated after conversion processing.

In a first possible implementation, the conversion processing includes at least a scaling parameter a and a bias parameter b, and the scaling parameter and the bias parameter are used to control a shape of a conversion characteristic curve of the conversion processing.

With reference to possible implementations of the first aspect, in a second possible implementation, the conversion processing includes at least a scaling parameter a and a bias parameter b, and the scaling parameter a and the bias parameter b meet: a+b=1.

With reference to the second possible implementation of the first aspect, in a third possible implementation, the conversion processing is:

$$L' = a\left(\left(\frac{pL}{(p-1)L+1}\right)^m - 1\right) + 1,$$

where a, m, and p are rational numbers, L is the input primary color signal, and L' is the image information generated after conversion processing.

With reference to possible implementations of the first aspect, in a fourth possible implementation, that a, b, m, and p are rational numbers includes:

a=1.12672, b=−0.12672, m=0.14, and p=2.2; or
a=1.19996, b=−0.19996, m=0.11, and p=1.1; or
a=1.17053, b=−0.17053, m=0.12, and p=1.4; or
a=1.14698, b=−0.14698, m=0.13, and p=1.8; or
a=1.11007, b=−0.11007, m=0.15, and p=2.7; or
a=1.12762, b=−0.127622, m=0.14, and p=2.3; or
a=1.13014, b=−0.13014, m=0.14, and p=2.6; or
a=1.11204, b=−0.112042, m=0.15, and p=3; or
a=1.09615, b=−0.0961462, m=0.16, and p=3.3.

With reference to possible implementations of the first aspect, in a fifth possible implementation, that a, b, m, and p are rational numbers includes:

a=1.2441, b=−0.2441, m=0.1, and p=1.1; or
a=1.20228, b=−0.20228, m=0.11, and p=1.2; or
a=1.17529, b=−0.17529, m=0.12, and p=1.7; or a=1.14933, b=−0.14933, m=0.13, and p=2; or
a=1.12762, b=−0.12762, m=0.14, and p=2.3; or
a=1.11204, b=−0.11204, m=0.15, and p=3; or
a=1.09615, b=−0.09615, m=0.16, and p=3.3.

With reference to possible implementations of the first aspect, in a sixth possible implementation, the primary color signal is a numeric value of a color component corresponding to specific color space.

With reference to possible implementations of the first aspect, in a seventh possible implementation, the primary color signal is a color component corresponding to specific color space, including at least an R component, a G component, a B component, or a Y component.

With reference to possible implementations of the first aspect, in an eighth possible implementation, the primary color signal is a numeric value of a color component corresponding to specific color space, and the numeric value is expressed in a floating-point number, a half-precision floating-point number, or a fixed-point number.

With reference to possible implementations of the first aspect, in a ninth possible implementation, the conversion processing is computation performed in normalized space [0,1].

With reference to possible implementations of the first aspect, in a tenth possible implementation, the primary color signal is a numeric value of an optical signal corresponding to a photographing scene in a camera, and the image information is a linear numeric expression value used for recording an original optical signal of a scene image in the camera; or the primary color signal is a linear numeric expression value of an original optical signal of the image, and the image information is a non-linear numeric expression value of an image generated after conversion processing; or the primary color signal is a first non-linear numeric expression value of the image, and the image information is a second non-linear numeric expression value of an image generated after conversion processing.

According to a second aspect, a method for processing image signal conversion is provided. The method includes:

obtaining input image information, where the image information is a numeric expression value of an image; and performing conversion processing on the image information, to obtain an output primary color signal, where the primary color signal is a value used by a display device to display a reference optical signal of the image, and the primary color signal is proportional to light intensity; and the conversion processing includes:

$$L = \frac{1}{p\left(\frac{L'-b}{a}\right)^{-\frac{1}{m}} - p + 1},$$

where a, b, m, and p are rational numbers, L' is the input image information, and L is the processed output primary color signal.

In a first possible implementation, the conversion processing includes at least a scaling parameter a and a bias parameter b, and the scaling parameter and the bias parameter are used to control a shape of a conversion characteristic curve of the conversion processing.

With reference to possible implementations of the second aspect, in a second possible implementation, the conversion processing includes at least a scaling parameter a and a bias parameter b, and the scaling parameter a and the bias parameter b meet: a+b=1.

With reference to the second possible implementation of the second aspect, in a third possible implementation, the conversion processing is:

$$L = \frac{1}{p\left(\frac{L'-1}{a}+1\right)^{-\frac{1}{m}} - p + 1},$$

where a, m, and p are rational numbers, L' is the input image information, and L is the processed output primary color signal.

With reference to possible implementations of the second aspect, in a fourth possible implementation, that a, b, m, and p are rational numbers includes:
  a=1.12672, b=−0.12672, m=0.14, and p=2.2; or
  a=1.19996, b=−0.19996, m=0.11, and p=1.1; or
  a=1.17053, b=−0.17053, m=0.12, and p=1.4; or
  a=1.14698, b=−0.14698, m=0.13, and p=1.8; or
  a=1.11007, b=−0.11007, m=0.15, and p=2.7; or
  a=1.12762, b=−0.127622, m=0.14, and p=2.3; or
  a=1.13014, b=−0.13014, m=0.14, and p=2.6; or
  a=1.11204, b=−0.112042, m=0.15, and p=3; or
  a=1.09615, b=−0.0961462, m=0.16, and p=3.3.

With reference to possible implementations of the second aspect, in a fifth possible implementation, that a, b, m, and p are rational numbers includes:
  a=1.2441, b=−0.2441, m=0.1, and p=1.1; or
  a=1.20228, b=−0.20228, m=0.11, and p=1.2; or
  a=1.17529, b=−0.17529, m=0.12, and p=1.7; or
  a=1.14933, b=−0.14933, m=0.13, and p=2; or
  a=1.12762, b=−0.12762, m=0.14, and p=2.3; or
  a=1.11204, b=−0.11204, m=0.15, and p=3; or
  a=1.09615, b=−0.09615, m=0.16, and p=3.3.

With reference to possible implementations of the second aspect, in a sixth possible implementation, the primary color signal is a numeric value of a color component corresponding to specific color space.

With reference to possible implementations of the second aspect, in a seventh possible implementation, a color component, of the primary color signal, corresponding to specific color space includes at least an R component, a G component, a B component, or a Y component.

With reference to possible implementations of the second aspect, in an eighth possible implementation, the processed output primary color signal is a numeric value of a color component corresponding to specific color space, and the numeric value is expressed in a floating-point number, a half-precision floating-point number, or a fixed-point number.

With reference to possible implementations of the second aspect, in a ninth possible implementation, the conversion processing is computation performed in normalized space [0,1].

With reference to possible implementations of the second aspect, in a tenth possible implementation, the image information is a non-linear numeric expression value that is used to display the image and that is input to a display terminal device, and the primary color signal is a numeric value of a corresponding optical signal in the display terminal device; or the image information is a non-linear numeric expression value of the input image, and the primary color signal is a linear numeric expression value; or the image information is a first non-linear numeric expression value of an image generated after conversion processing, and the primary color signal is a second non-linear numeric expression value of the image.

According to a third aspect, an apparatus for processing image signal conversion is provided. The apparatus includes:

a signal obtaining unit, configured to obtain an input primary color signal, where the primary color signal is a numeric value of an optical signal corresponding to an image, and the primary color signal is proportional to light intensity; and a conversion processing unit, configured to perform conversion processing on the primary color signal, to obtain processed image information, where the image information is a numeric expression value of the image, and the conversion processing includes at least the following processing:

$$L' = a\left(\frac{pL}{(p-1)L+1}\right)^m + b,$$

where a, b, m, and p are rational numbers, L is the input primary color signal, and L' is the image information generated after conversion processing.

In a first possible implementation, the conversion processing includes at least a scaling parameter a and a bias parameter b, and the scaling parameter and the bias parameter are used to control a shape of a conversion characteristic curve of the conversion processing.

With reference to possible implementations of the third aspect, in a second possible implementation, the conversion processing includes at least a scaling parameter a and a bias parameter b, and the scaling parameter a and the bias parameter b meet: a+b=1.

With reference to the second possible implementation of the third aspect, in a third possible implementation, the conversion processing is:

$$L' = a\left(\left(\frac{pL}{(p-1)L+1}\right)^m - 1\right) + 1,$$

where a, m, and p are rational numbers, L is the input primary color signal, and L' is the image information generated after conversion processing.

With reference to possible implementations of the third aspect, in a fourth possible implementation, that a, b, m, and p are rational numbers includes:
  a=1.12672, b=−0.12672, m=0.14, and p=2.2; or
  a=1.19996, b=−0.19996, m=0.11, and p=1.1; or
  a=1.17053, b=−0.17053, m=0.12, and p=1.4; or
  a=1.14698, b=−0.14698, m=0.13, and p=1.8; or
  a=1.11007, b=−0.11007, m=0.15, and p=2.7; or
  a=1.12762, b=−0.127622, m=0.14, and p=2.3; or
  a=1.13014, b=−0.13014, m=0.14, and p=2.6; or
  a=1.11204, b=−0.112042, m=0.15, and p=3; or
  a=1.09615, b=−0.0961462, m=0.16, and p=3.3.

With reference to possible implementations of the third aspect, in a fifth possible implementation, that a, b, m, and p are rational numbers includes:
  a=1.2441, b=−0.2441, m=0.1, and p=1.1; or
  a=1.20228, b=−0.20228, m=0.11, and p=1.2; or
  a=1.17529, b=−0.17529, m=0.12, and p=1.7; or
  a=1.14933, b=−0.14933, m=0.13, and p=2; or a=1.12762, b=−0.12762, m=0.14, and p=2.3; or
a=1.11204, b=−0.11204, m=0.15, and p=3; or
a=1.09615, b=−0.09615, m=0.16, and p=3.3.

With reference to possible implementations of the third aspect, in a sixth possible implementation, the primary color signal is a numeric value of a color component corresponding to specific color space.

With reference to possible implementations of the third aspect, in a seventh possible implementation, the primary color signal is a color component corresponding to specific color space, including at least an R component, a G component, a B component, or a Y component.

With reference to possible implementations of the third aspect, in an eighth possible implementation, the primary color signal is a numeric value of a color component corresponding to specific color space, and the numeric value is expressed in a floating-point number, a half-precision floating-point number, or a fixed-point number.

With reference to possible implementations of the third aspect, in a ninth possible implementation, the conversion processing is computation performed in normalized space [0,1].

With reference to possible implementations of the third aspect, in a tenth possible implementation, the primary color signal is a numeric value of an optical signal corresponding to a photographing scene in a camera, and the image information is a linear numeric expression value used for recording an original optical signal of a scene image in the camera; or the primary color signal is a linear numeric expression value of an original optical signal of the image, and the image information is a non-linear numeric expression value of an image generated after conversion processing; or the primary color signal is a first non-linear numeric expression value of the image, and the image information is a second non-linear numeric expression value of an image generated after conversion processing.

According to a fourth aspect, an apparatus for processing image signal conversion is provided. The apparatus includes:

an information obtaining unit, configured to obtain input image information, where the image information is a numeric expression value of an image; and a conversion processing unit, configured to perform conversion processing on the image information, to obtain an output primary color signal, where the primary color signal is a value used by a display device to display a reference optical signal of the image, and the primary color signal is proportional to light intensity; and the conversion processing includes:

$$L = \frac{1}{p\left(\frac{L'-b}{a}\right)^{-\frac{1}{m}} - p + 1},$$

where a, b, m, and p are rational numbers, L' is the input image information, and L is the processed output primary color signal.

In a first possible implementation, the conversion processing includes at least a scaling parameter a and a bias parameter b, and the scaling parameter and the bias parameter are used to control a shape of a conversion characteristic curve of the conversion processing.

With reference to possible implementations of the fourth aspect, in a second possible implementation, the conversion processing includes at least a scaling parameter a and a bias parameter b, and the scaling parameter a and the bias parameter b meet: a+b=1.

With reference to the second possible implementation of the fourth aspect, in a third possible implementation, the conversion processing is:

$$L = \frac{1}{p\left(\frac{L'-1}{a}+1\right)^{-\frac{1}{m}} - p + 1},$$

where a, m, and p are rational numbers, L' is the input image information, and L is the processed output primary color signal.

With reference to possible implementations of the fourth aspect, in a fourth possible implementation, that a, b, m, and p are rational numbers includes:
a=1.12672, b=−0.12672, m=0.14, and p=2.2; or
a=1.19996, b=−0.19996, m=0.11, and p=1.1; or
a=1.17053, b=−0.17053, m=0.12, and p=1.4; or
a=1.14698, b=−0.14698, m=0.13, and p=1.8; or
a=1.11007, b=−0.11007, m=0.15, and p=2.7; or
a=1.12762, b=−0.127622, m=0.14, and p=2.3; or
a=1.13014, b=−0.13014, m=0.14, and p=2.6; or
a=1.11204, b=−0.112042, m=0.15, and p=3; or
a=1.09615, b=−0.0961462, m=0.16, and p=3.3.

With reference to possible implementations of the fourth aspect, in a fifth possible implementation, that a, b, m, and p are rational numbers includes:
a=1.2441, b=−0.2441, m=0.1, and p=1.1; or
a=1.20228, b=−0.20228, m=0.11, and p=1.2; or
a=1.17529, b=−0.17529, m=0.12, and p=1.7; or
a=1.14933, b=−0.14933, m=0.13, and p=2; or
a=1.12762, b=−0.12762, m=0.14, and p=2.3; or
a=1.11204, b=−0.11204, m=0.15, and p=3; or
a=1.09615, b=−0.09615, m=0.16, and p=3.3.

With reference to possible implementations of the fourth aspect, in a sixth possible implementation, the primary color signal is a numeric value of a color component corresponding to specific color space.

With reference to possible implementations of the fourth aspect, in a seventh possible implementation, a color component, of the primary color signal, corresponding to specific color space includes at least an R component, a G component, a B component, or a Y component.

With reference to possible implementations of the fourth aspect, in an eighth possible implementation, the processed output primary color signal is a numeric value of a color component corresponding to specific color space, and the numeric value is expressed in a floating-point number, a half-precision floating-point number, or a fixed-point number.

With reference to possible implementations of the fourth aspect, in a ninth possible implementation, the conversion processing is computation performed in normalized space [0,1].

With reference to possible implementations of the fourth aspect, in a tenth possible implementation, the image information is a non-linear numeric expression value that is used to display the image and that is input to a display terminal device, and the primary color signal is a numeric value of a corresponding optical signal in the display terminal device; or the image information is a non-linear numeric expression value of the input image, and the primary color signal is a linear numeric expression value; or the image information is a first non-linear numeric expression value of an image generated after conversion processing, and the primary color signal is a second non-linear numeric expression value of the image.

According to a fifth aspect, a computer storage medium is provided. The computer storage medium may store a program. When the program is executed, some or all of the steps in the first aspect are included.

According to a sixth aspect, a computer storage medium is provided. The computer storage medium may store a program. When the program is executed, some or all of the steps in the second aspect are included.

According to a seventh aspect, a terminal device is provided. The terminal device includes a processor and a memory. The memory is configured to store an instruction. The processor is configured to execute the instruction. When executing the instruction, the processor may be configured to perform some or all of the steps with reference to the first aspect.

According to an eighth aspect, a terminal device is provided. The terminal device includes a processor and a memory. The memory is configured to store an instruction. The processor is configured to execute the instruction. When executing the instruction, the processor may be configured to perform some or all of the steps with reference to the second aspect.

According to a ninth aspect, a method for encoding a high dynamic range image is provided. The method includes:

obtaining an input primary color signal, where the primary color signal is a numeric value of an optical signal corresponding to an image, and the primary color signal is proportional to light intensity;

performing conversion processing on the primary color signal, to obtain processed image information, where the image information is a numeric expression value of the image, and the conversion processing includes at least the following processing:

$$L' = a\left(\frac{pL}{(p-1)L+1}\right)^m + b,$$

where a, b, m, and p are rational numbers, L is the input primary color signal, and L' is the image information generated after conversion processing;

performing color space transfer and a quantization operation on the image information generated after conversion processing, to obtain quantized image information; and encoding the quantized image information.

In a first possible implementation, that a, b, m, and p are rational numbers includes:

a=1.2441, b=−0.2441, m=0.1, and p=1.1; or
a=1.20228, b=−0.20228, m=0.11, and p=1.2; or
a=1.17529, b=−0.17529, m=0.12, and p=1.7; or
a=1.14933, b=−0.14933, m=0.13, and p=2; or
a=1.12762, b=−0.12762, m=0.14, and p=2.3; or
a=1.11204, b=−0.11204, m=0.15, and p=3; or
a=1.09615, b=−0.09615, m=0.16, and p=3.3.

With reference to possible implementations of the ninth aspect, in a second possible implementation, the conversion processing is computation performed in normalized space [0,1].

With reference to possible implementations of the ninth aspect, in a third possible implementation, the quantization operation is scaling computation from a floating-point number to a fixed-point number, and the quantization operation is 8-bit, 10-bit, 12-bit, 14-bit, or 16-bit computation.

With reference to possible implementations of the ninth aspect, in a fourth possible implementation, the encoding the quantized image information includes:

if a sampling format used by the quantized image information is different from a sampling format used by an encoder, converting the sampling format used by the quantized image information into the sampling format used by the encoder.

With reference to possible implementations of the ninth aspect, in a fifth possible implementation, if the image uses a 4:4:4 sampling format and an encoder uses a 4:2:0 sampling format, downsampling is performed on the image that uses the 4:4:4 sampling format, to convert the 4:4:4 sampling format into the 4:2:0 sampling format; or if the image uses a 4:4:4 sampling format and an encoder uses a 4:2:2 sampling format, downsampling is performed on the image that uses the 4:4:4 sampling format, to convert the 4:4:4 sampling format into the 4:2:2 sampling format.

With reference to possible implementations of the ninth aspect, in a sixth possible implementation, the encoding the quantized image information includes:

encoding reference display information of the primary color signal corresponding to the image to a bitstream, where the reference display information is a maximum value of the primary color signal, a minimum value of the primary color signal, or an average value of the primary color signal; or a maximum value of ambient light, a minimum value of ambient light, or an average value of ambient light when an image is collected.

With reference to possible implementations of the ninth aspect, in a seventh possible implementation, identification information used for identifying the conversion processing is written into an encoded bitstream.

In specific implementation, a terminal device obtains the input primary color signal. The primary color signal is corresponding to a numeric value of a specific image color component (for example, R, G, B, or Y), and a value of the primary color signal is normalized to [0,1]. The primary color signal is referred to as L or E for short, and is generally proportional to the light intensity. The terminal device processes the primary color signal (a normalized primary color signal value) by using the following optical-electro transfer function, to obtain the processed image information:

$$L' = a\left(\frac{pL}{(p-1)L+1}\right)^m + b,$$

where a, b, m, and p are rational numbers, L is the input primary color signal, and L' is the image information generated after conversion processing.

The terminal device performs color space transfer on the processed image information, to obtain image information generated after color space transfer.

The terminal device performs floating-point-to-fixed-point conversion on the image information generated after color space transfer, to obtain image information generated after floating-point-to-fixed-point conversion.

The terminal device performs 4:4:4-to-4:2:0 downsampling on the image information generated after floating-point-to-fixed-point conversion, to obtain image information generated after downsampling.

The terminal device encodes 4:2:0 image information, to obtain encoded image information.

In this technical solution, a dynamic range of a display device is a 0-255 gray scale. A dynamic range of a real world reaches $10^7$. Because a dynamic range concerns brightness information, a brightness range of the display device is not sufficient to represent a brightness domain of the real world. If the entire brightness domain of the real world is simply compressed, in a linear manner, into a brightness domain that the display device can represent, relatively more details are lost at bright and dim ends. In order to overcome this situation, an optical-electro transfer function is proposed. A conventional optical-electro transfer function may be an optical-electro transfer function in scheme 1, as shown in FIG. 1A. A second curve includes Weber scores obtained by using the optical-electro transfer function in scheme 1. A fourth curve includes Weber scores obtained by using an optical-electro transfer function in this application. It can be learned that Weber scores, of the second curve, that are obtained when a brightness value is less than 0.1 nits exceed a Schreiber threshold, resulting in that an output HDR image generates stripe noise that a human eye can perceive and cannot meet a quality requirement, whereas while meeting the Schreiber threshold, the fourth curve has a brightness value that may reach 10000 nits. Therefore, a method for processing a high dynamic range image provided in this application can improve quantization quality.

A primary color signal is expressed in a unit of nits. The primary color signal may include a primary color signal of each channel. For example, when the image is an RGB image, the primary color signal may include primary color signals of R, G, and B channels. The primary color signal may also be a primary color signal of an R channel, a G channel, a B channel, or a Y channel. When the image is an image in a Lab mode, the primary color signal may include primary color signals of L, a, and b channels. The primary color signal may include a normalized primary color signal value. For example, brightness of the real world is divided by $10^4$, to obtain a normalized primary color signal. The normalized primary color signal is in a range of 0 to 1.

a, b, m, and p are rational numbers. Optionally, a relationship between a and b may be: a+b=1. For example, a=1.12672, b=−0.12672, m=0.14, and p=2.2. For another example, a=1.19996, b=−0.19996, m=0.11, and p=1.1. For another example, a=1.17053, b=−0.17053, m=0.12, and p=1.4. For another example, a=1.14698, b=−0.14698, m=0.13, and p=1.8. For another example, a=1.11007, b=−0.11007, m=0.15, and p=2.7. For another example, a=1.13014, b=−0.13014, m=0.14, and p=2.6. For another example, a=1.2441, b=−0.2441, m=0.1, and p=1.1. For another example, a=1.20228, b=−0.20228, m=0.11, and p=1.2. For another example, a=1.17529, b=−0.17529, m=0.12, and p=1.7. For another example, a=1.14933, b=−0.14933, m=0.13, and p=2. For another example, a=1.12762, b=−0.12762, m=0.14, and p=2.3. For another example, a=1.11204, b=−0.11204, m=0.15, and p=3. For another example, a=1.09615, b=−0.09615, m=0.16, and p=3.3.

Further, the terminal device may perform the following processing on the primary color signal, to obtain the processed image information:

$$L' = a\left(\left(\frac{pL}{(p-1)L+1}\right)^m - 1\right) + 1,$$

where a, m, and p are rational numbers, L is the input primary color signal (the normalized primary color signal value), and L' is the image information generated after conversion processing.

Optionally, a relationship between a and b may also be: a+1:01. For example, a=1.11204, b=−0.122042, m=0.15, and p=3. For another example, a=1.09615, b=−0.1161462, m=0.16, and p=3.3. For another example, a=1.12762, b=−0.127622, m=0.14, and p=2.3. For another example, a=1.11204, b=−0.112042, m=0.15, and p=3. For another example, a=1.09615, b=−0.0961462, m=0.16, and p=3.3. It should be noted that a, b, m, and p are preset rational numbers, and may be an empirical value determined by a research and development person, or may be a value derived from a Weber score in an experiment process. This is not specifically restricted in embodiments of the present disclosure.

In a possible design, the terminal device may combine the method for processing a high dynamic range image provided in this application with an HDR video encoding framework that complies with an ISO standard, to improve resource utilization while improving quantization quality. The conventional HDR video encoding framework may include an optical-electro transfer module, a color space transfer module, a floating-point-to-fixed-point conversion module, a downsampling processing module, and an encoding module. The optical-electro transfer module is configured to perform optical-electro transfer on a primary color signal by using an optical-electro transfer function, to obtain processed image information. The color space transfer module is configured to transfer the processed image information to YCbCr space, to obtain image information generated after space transfer. The floating-point-to-fixed-point conversion module is configured to perform, in the YCbCr space, floating-point-to-fixed-point conversion on the image information generated after space transfer, to convert the image information generated after space transfer into 8/10-bit data by using a floating-point-to-fixed-point conversion operation. The downsampling processing module is configured to perform 4:4:4-to-4:2:0 conversion on image information generated after floating-point-to-fixed-point conversion. The encoding module is configured to encode 4:2:0 image information generated after conversion, to obtain encoded image information. Then, after obtaining, by performing optical-electro transfer on the primary color signal by using $$L' = a\left(\frac{pL}{(p-1)L+1}\right)^m + b,$$

in this application, processed image information, the terminal device may transfer, by using a preset space transfer function, the processed image information to the YCbCr space, to obtain image information generated after space transfer; quantize, in the YCbCr space, the image information generated after space transfer, to obtain the quantized image information; perform downsampling on the quantized image information, to obtain image information generated after downsampling; and encode the image information generated after downsampling, to obtain the encoded image information.

The YCbCr space is color space. The YCbCr space is used to compress brightness information for effective transmission of an image.

According to a tenth aspect, a method for decoding a high dynamic range image is provided. The method includes:

obtaining first image information and image reference display information that are output by a decoder after the decoder performs decoding, and performing sampling processing to convert a sampling format into a 4:4:4 sampling format;

performing a dequantization operation on the image information that uses the 4:4:4 sampling format, and transferring the image information to specific color space, to obtain second image information;

performing conversion processing on the second image information, to obtain an output primary color signal, where the primary color signal is a value used by a display device to display a reference optical signal of the image, and the primary color signal is proportional to light intensity; and the conversion processing includes:

$$L = \frac{1}{p\left(\frac{L'-b}{a}\right)^{-\frac{1}{m}} - p + 1},$$

where a, b, m, and p are rational numbers, L' is input image information, and L is the processed output primary color signal; and obtaining, based on the primary color signal and reference assistance information, an image that is used for being output to a display.

In a first possible implementation, that a, b, m, and p are rational numbers includes:

a=1.2441, b=−0.2441, m=0.1, and p=1.1; or
a=1.20228, b=−0.20228, m=0.11, and p=1.2; or
a=1.17529, b=−0.17529, m=0.12, and p=1.7; or
a=1.14933, b=−0.14933, m=0.13, and p=2; or
a=1.12762, b=−0.12762, m=0.14, and p=2.3; or
a=1.11204, b=−0.11204, m=0.15, and p=3; or
a=1.09615, b=−0.09615, m=0.16, and p=3.3.

With reference to possible implementations of the tenth aspect, in a second possible implementation, the conversion processing is computation performed in normalized space [0,1].

With reference to possible implementations of the tenth aspect, in a third possible implementation, the dequantization operation is scaling computation from a fixed-point number to a floating-point number, and the dequantization operation is 8-bit, 10-bit, 12-bit, 14-bit, or 16-bit computation.

With reference to possible implementations of the tenth aspect, in a fourth possible implementation, the sampling processing includes:

if the first image uses a 4:2:0 sampling format, performing upsampling on the first image, to convert the 4:2:0 sampling format into the 4:4:4 sampling format; or if the first image uses a 4:2:2 sampling format, performing upsampling on the first image, to convert the 4:2:2 sampling format into the 4:4:4 sampling format.

With reference to possible implementations of the tenth aspect, in a fifth possible implementation, the image reference display information is a maximum value of a primary color signal, a minimum value of a primary color signal, or an average value of a primary color signal; or a maximum value of ambient light, a minimum value of ambient light, or an average value of ambient light when an image is collected.

With reference to possible implementations of the tenth aspect, in a sixth possible implementation, identification information used for identifying the conversion processing is obtained from an encoded bitstream.

In specific implementation, a terminal device obtains the input image information.

The terminal device decodes the image information, to obtain decoded image information.

The terminal device performs upsampling on the decoded image information, to obtain image information generated after upsampling.

The terminal device performs fixed-point-to-floating-point conversion on the image information generated after upsampling, to obtain image information generated after fixed-point-to-floating-point conversion.

The terminal device performs color space transfer on the image information generated after fixed-point-to-floating-point conversion, to obtain image information generated after color space transfer.

The terminal device performs, by using the following electro-optical transfer function, conversion processing on the image information generated after color space transfer, to obtain the output primary color signal:

$$L = \frac{1}{p\left(\frac{L'-b}{a}\right)^{-\frac{1}{m}} - p + 1},$$

where a, b, m, and p are rational numbers, L' is the input image information, and L is the processed output primary color signal.

The electro-optical transfer function is sometimes referred to as an electro-optical transfer function.

In this technical solution, the method for processing image signal conversion in the second aspect is a reverse process of the method for processing image signal conversion in the first aspect.

a, b, m, and p are rational numbers. Optionally, a relationship between a and b may be: a+b=1. For example, a=1.12672, b=−0.12672, m=0.14, and p=2.2. For another example, a=1.19996, b=−0.19996, m=0.11, and p=1.1. For another example, a=1.17053, b=−0.17053, m=0.12, and p=1.4. For another example, a=1.14698, b=−0.14698, m=0.13, and p=1.8. For another example, a=1.11007, b=−0.11007, m=0.15, and p=2.7. For another example, a=1.13014, b=−0.13014, m=0.14, and p=2.6. For another example, a=1.2441, b=−0.2441, m=0.1, and p=1.1. For another example, a=1.20228, b=−0.20228, m=0.11, and p=1.2. For another example, a=1.17529, b=−0.17529, m=0.12, and p=1.7. For another example, a=1.14933, b=−0.14933, m=0.13, and p=2. For another example, a=1.12762, b=−0.12762, m=0.14, and p=2.3. For another example, a=1.11204, b=−0.11204, m=0.15, and p=3. For another example, a=1.09615, b=−0.09615, m=0.16, and p=3.3. Further, the terminal device may perform the following processing on dequantized image information, to obtain processed image information:

$$L = \frac{1}{p\left(\frac{L'-1+a}{a}\right)^{-\frac{1}{m}} - p + 1},$$

where a, p, and m are rational numbers, L' is an input image signal, and L is the processed output primary color signal.

Optionally, a relationship between a and b may also be: a+b≠1. For example, a=1.11204, b=−0.122042, m=0.15, and p=3. For another example, a=1.09615, b=−0.1161462, m=0.16, and p=3.3. For another example, a=1.12762, b=−0.127622, m=0.14, and p=2.3. For another example, a=1.11204, b=−0.112042, m=0.15, and p=3. For another example, a=1.09615, b=−0.0961462, m=0.16, and p=3.3. It should be noted that a, b, m, and p are preset rational numbers, and may be an empirical value determined by a research and development person, or may be a value derived from a Weber score in an experiment process. This is not specifically restricted in embodiments of the present disclosure.

In a possible design, the terminal device may combine the method for processing image signal conversion provided in this application with a conventional HDR video decoding framework that complies with an ISO standard, to improve resource utilization while improving quantization quality. The conventional HDR video decoding framework may include a decoding module, an upsampling module, a fixed-point-to-floating-point conversion module, a color space transfer module, and an electro-optical transfer module. The decoding module is configured to decode encoded image information. The upsampling module is configured to perform 4:2:0-to-4:4:4 conversion on decoded image information. The fixed-point-to-floating-point conversion module is configured to perform fixed-point-to-floating-point conversion on image information generated after upsampling, to obtain image information generated after fixed-point-to-floating-point conversion. The color space transfer module is configured to perform color space transfer on the image information generated after fixed-point-to-floating-point conversion, to obtain image information generated after color space transfer. The electro-optical transfer module is configured to perform electro-optical transfer on the image information, to obtain an output primary color signal. Then, the terminal device may obtain encoded image information; decode the encoded image information, to obtain the decoded image information; perform upsampling on the decoded image information, to obtain the image information generated after upsampling; perform fixed-point-to-floating-point conversion on the image information generated after upsampling, to obtain the image information generated after fixed-point-to-floating-point conversion; perform color space transfer on the image information generated after fixed-point-to-floating-point conversion, to obtain the image information generated after color space transfer; and perform electro-optical transfer on the image information by using $$L = \frac{1}{p\left(\frac{L'-b}{a}\right)^{-\frac{1}{m}} - p + 1}$$

in this application, to obtain the output primary color signal.

According to an eleventh aspect, an apparatus for encoding a high dynamic range image is provided. The apparatus includes:

a primary color signal obtaining unit, configured to obtain an input primary color signal, where the primary color signal is a numeric value of an optical signal corresponding to an image, and the primary color signal is proportional to light intensity;

a conversion processing unit, configured to perform conversion processing on the primary color signal, to obtain processed image information, where the image information is a numeric expression value of the image, and the conversion processing includes at least the following processing:

$$L' = a\left(\frac{pL}{(p-1)L+1}\right)^m + b,$$

where a, b, m, and p are rational numbers, L is the input primary color signal, and L' is the image information generated after conversion processing;

a quantization unit, configured to perform color space transfer and a quantization operation on the image information generated after conversion processing, to obtain quantized image information; and an encoding unit, configured to encode the quantized image information.

In a first possible implementation, that a, b, m, and p are rational numbers includes:
a=1.2441, b=−0.2441, m=0.1, and p=1.1; or
a=1.20228, b=−0.20228, m=0.11, and p=1.2; or
a=1.17529, b=−0.17529, m=0.12, and p=1.7; or
a=1.14933, b=−0.14933, m=0.13, and p=2; or
a=1.12762, b=−0.12762, m=0.14, and p=2.3; or
a=1.11204, b=−0.11204, m=0.15, and p=3; or
a=1.09615, b=−0.09615, m=0.16, and p=3.3.

With reference to possible implementations of the eleventh aspect, in a second possible implementation, the conversion processing is computation performed in normalized space [0,1].

With reference to possible implementations of the eleventh aspect, in a third possible implementation, the quantization operation performed by the quantization unit is scaling computation from a floating-point number to a fixed-point number, and the quantization operation is 8-bit, 10-bit, 12-bit, 14-bit, or 16-bit computation.

With reference to possible implementations of the eleventh aspect, in a fourth possible implementation, the encoding unit is configured to: if a sampling format used by the quantized image information is different from a sampling format used by an encoder, convert the sampling format used by the quantized image information into the sampling format used by the encoder.

With reference to possible implementations of the eleventh aspect, in a fifth possible implementation, if the image uses a 4:4:4 sampling format and an encoder uses a 4:2:0 sampling format, the quantization unit is further configured to perform downsampling on the image that uses the 4:4:4 sampling format, to convert the 4:4:4 sampling format into the 4:2:0 sampling format; or if the image uses a 4:4:4 sampling format and an encoder uses a 4:2:2 sampling format, the quantization unit is further configured to perform downsampling on the image that uses the 4:4:4 sampling format, to convert the 4:4:4 sampling format into the 4:2:2 sampling format.

With reference to possible implementations of the eleventh aspect, in a sixth possible implementation, the encoding unit is configured to encode reference display information of the primary color signal corresponding to the image to a bitstream, where the reference display information is a maximum value of the primary color signal, a minimum value of the primary color signal, or an average value of the primary color signal; or a maximum value of ambient light, a minimum value of ambient light, or an average value of ambient light when an image is collected.

With reference to possible implementations of the eleventh aspect, in a seventh possible implementation, identification information used for identifying the conversion processing is written into an encoded bitstream.

According to a twelfth aspect, an apparatus for decoding a high dynamic range image is provided. The apparatus includes:

a sampling unit, configured to obtain first image information and image reference display information that are output by a decoder after the decoder performs decoding, and perform sampling processing to convert a sampling format into a 4:4:4 sampling format;

a dequantization unit, configured to perform a dequantization operation on image information that uses the 4:4:4 sampling format, and transfer the image information to specific color space, to obtain second image information;

a conversion processing unit, configured to perform conversion processing on the second image information, to obtain an output primary color signal, where the primary color signal is a value used by a display device to display a reference optical signal of the image, and the primary color signal is proportional to light intensity; and the conversion processing includes:

$$L = \frac{1}{p\left(\frac{L'-b}{a}\right)^{-\frac{1}{m}} - p + 1},$$

where a, b, m, and p are rational numbers, L' is input image information, and L is the processed output primary color signal; and an obtaining unit, configured to obtain, based on the primary color signal and reference assistance information, an image that is used for being output to a display.

In a first possible implementation, that a, b, m, and p are rational numbers includes:

a=1.2441, b=−0.2441, m=0.1, and p=1.1; or
a=1.20228, b=−0.20228, m=0.11, and p=1.2; or
a=1.17529, b=−0.17529, m=0.12, and p=1.7; or
a=1.14933, b=−0.14933, m=0.13, and p=2; or
a=1.12762, b=−0.12762, m=0.14, and p=2.3; or
a=1.11204, b=−0.11204, m=0.15, and p=3; or
a=1.09615, b=−0.09615, m=0.16, and p=3.3.

With reference to possible implementations of the twelfth aspect, in a second possible implementation, the conversion processing is computation performed in normalized space [0,1].

With reference to possible implementations of the twelfth aspect, in a third possible implementation, the dequantization operation performed by the dequantization unit is scaling computation from a fixed-point number to a floating-point number, and the dequantization operation is 8-bit, 10-bit, 12-bit, 14-bit, or 16-bit computation.

With reference to possible implementations of the twelfth aspect, in a fourth possible implementation, the sampling unit performs the sampling processing, and is specifically configured to:

if the first image uses a 4:2:0 sampling format, perform upsampling on the first image, to convert the 4:2:0 sampling format into the 4:4:4 sampling format; or if the first image uses a 4:2:2 sampling format, perform upsampling on the first image, to convert the 4:2:2 sampling format into the 4:4:4 sampling format.

With reference to possible implementations of the twelfth aspect, in a fifth possible implementation, the image reference display information is a maximum value of a primary color signal, a minimum value of a primary color signal, or an average value of a primary color signal; or a maximum value of ambient light, a minimum value of ambient light, or an average value of ambient light when an image is collected.

With reference to possible implementations of the twelfth aspect, in a sixth possible implementation, identification information used for identifying the conversion processing is obtained from an encoded bitstream.

According to a thirteenth aspect, a computer storage medium is provided. The computer storage medium may store a program. When the program is executed, some or all of the steps in the ninth aspect are included.

According to a fourteenth aspect, a computer storage medium is provided. The computer storage medium may store a program. When the program is executed, some or all of the steps in the tenth aspect are included.

According to a fifteenth aspect, a terminal device is provided. The terminal device includes a processor and a memory. The memory is configured to store an instruction. The processor is configured to execute the instruction. When executing the instruction, the processor may be configured to perform some or all of the steps with reference to the ninth aspect.

According to a sixteenth aspect, a terminal device is provided. The terminal device includes a processor and a memory. The memory is configured to store an instruction. The processor is configured to execute the instruction. When executing the instruction, the processor may be configured to perform some or all of the steps with reference to the tenth aspect.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person of ordinary skill in the art may still derive other drawings from these accompanying drawings without creative efforts.

FIG. 2A and FIG. 2B are schematic flowcharts of a method for processing image signal conversion according to an embodiment of the present disclosure;

DESCRIPTION OF EMBODIMENTS

The following clearly describes the technical solutions in the embodiments of the present disclosure with reference to the accompanying drawings in the embodiments of the present disclosure.

Figure 2A:
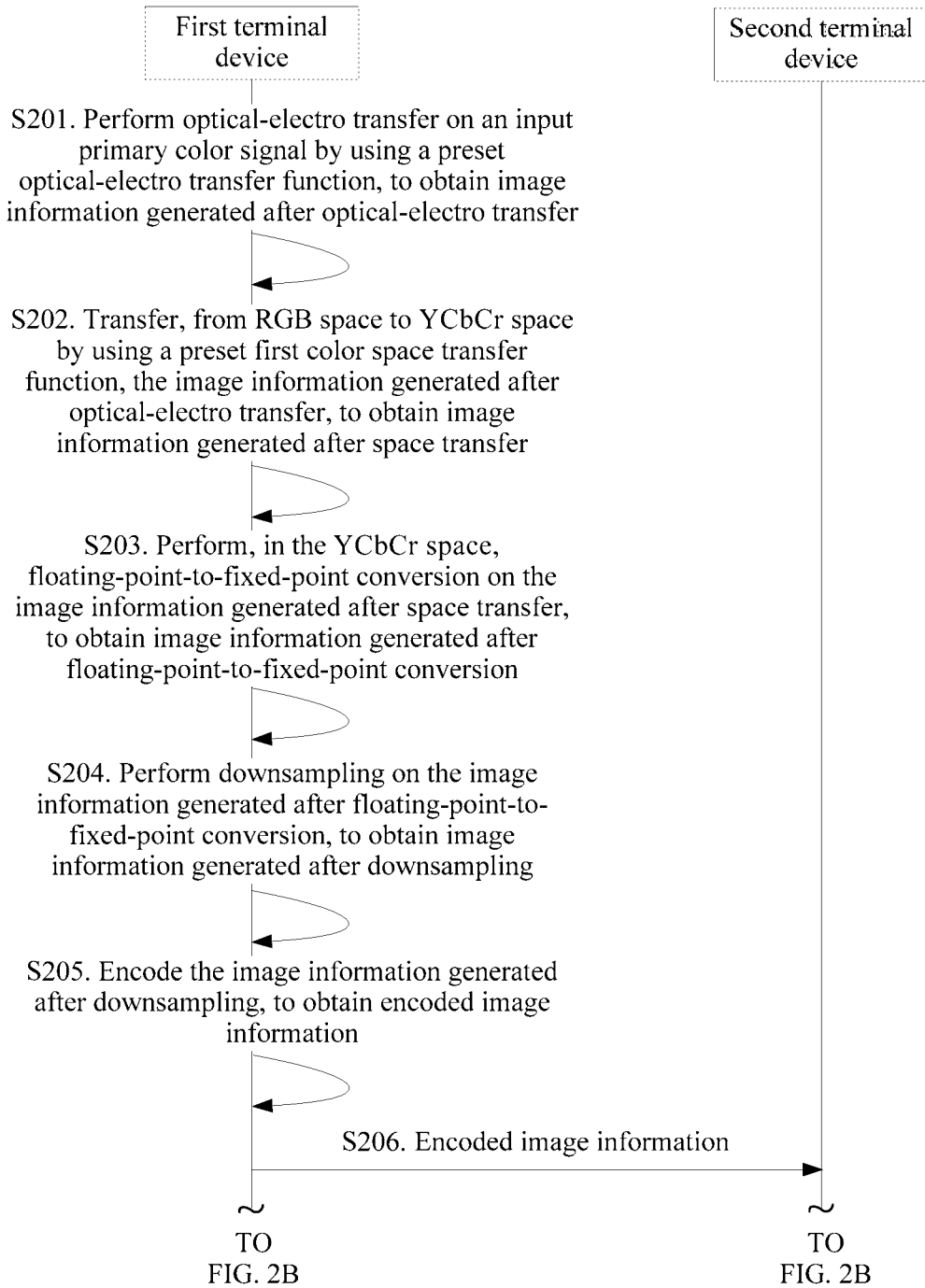

Referring to FIG. 2A and FIG. 2B, FIG. 2A and FIG. 2B are schematic flowcharts of a method for processing image signal conversion according to an embodiment of the present disclosure. As shown in the figure, the method for processing image signal conversion in this embodiment of the present disclosure may include at least the following steps.

S201. A first terminal device performs optical-electro transfer on an input primary color signal by using a preset optical-electro transfer function, to obtain image information generated after optical-electro transfer.

The terminal device may perform optical-electro transfer on the input primary color signal by using the preset optical-electro transfer function, to obtain the image information generated after optical-electro transfer. The terminal device may be a satellite, a personal computer (PC), a smartphone, or the like.

In specific implementation, a quantization curve simulates a change in perceptive details of a human eye for different brightness. Based on statistics on a test sequence, it is learned that there is a relatively large difference between a brightness distribution curve of a real world and a curve that simulates how the human eye perceives brightness. For example, dynamic-range statistics are collected on an existing CT2020 HDR high-definition sequence. Six brightness intervals are obtained through division, to collect the statistics, and a statistical result is shown in Table 1.

TABLE 1

| | Brightness interval (nits) | | | | |
|---|---|---|---|---|---|
| | 0~1000 | 1000~2000 | 2000~3000 | 3000~4000 | >4000 |
| Sequence A | 99.849% | 0.101% | 0.038% | 0.012% | 0.000% |
| Sequence B | 99.938% | 0.035% | 0.015% | 0.012% | 0.000% |
| Sequence C | 80.851% | 14.566% | 3.329% | 1.254% | 0.000% |
| Sequence D | 92.156% | 7.227% | 0.388% | 0.192% | 0.038% |

It can be learned from Table 1 that although the HDR sequence has a relatively high dynamic range, main brightness is distributed between 0 nits and 2000 nits (excluding 2000 nits). Brightness distributed between 0 nits and 1000 nits accounts for 80% to 99%, and brightness distributed between 0 nits and 2000 nits (excluding 2000 nits) accounts for 97% to 99%. Therefore, considering a sensitivity characteristic of the human eye for brightness, from a vision characteristic of the human eye, a range with brightness between 0 nits and 10000 nits is used as a key protected brightness segment of the quantization curve.

A conventional rational quantization function is:

$$F(L) = \frac{pL}{(p-1)L+1},$$

where p is a preset parameter, L is brightness information of a real world, and F(L) is a quantized value. A quantization curve of a rational quantization function shown in FIG. 1B is used as an example. The curve is in a relatively simple form, and has a relatively good adaptation characteristic. However, Weber scores of a rational quantization curve have a relatively poor effect. A dynamic range that is less than a Schreiber threshold is quite narrow, and the Weber scores of the rational quantization curve cannot be completely distributed under the Schreiber threshold.

In addition, a Gamma function is defined in the ITU-R Recommendation BT.1886 standard. The Gamma function is an early optical-electro transfer function. The Gamma function is shown as follows:

$L = a(\max[(V+b), 0])^r$, where

L represents image information generated after optical-electro transfer, $$a = \left(L_W^{\frac{1}{r}} - L_B^{\frac{1}{r}}\right)^r,$$

V represents brightness information of a real world, $$b = \frac{L_B^{\frac{1}{r}}}{L_W^{\frac{1}{r}} - L_B^{\frac{1}{r}}},$$

and r=2.4.

An image that is displayed on a display device with brightness of 100 nits by using the Gamma function has relatively good quality. However, with an upgrade of the display device, when the brightness of the display device is 600 nits or 2000 nits, an image that is output by using the Gamma function cannot be normally displayed on the display device.

Therefore, with reference to the rational quantization function and the Gamma function, an optical-electro transfer function in this application is proposed in this embodiment of the present disclosure. A Weber score obtained through calculation by using the optical-electro transfer function accords with a distribution characteristic of scenario brightness statistics, making the quantization curve better accord with a characteristic of human eye perception, that is, effectively expanding a dynamic range that meets a Weber score constraint.

Figure 1A:
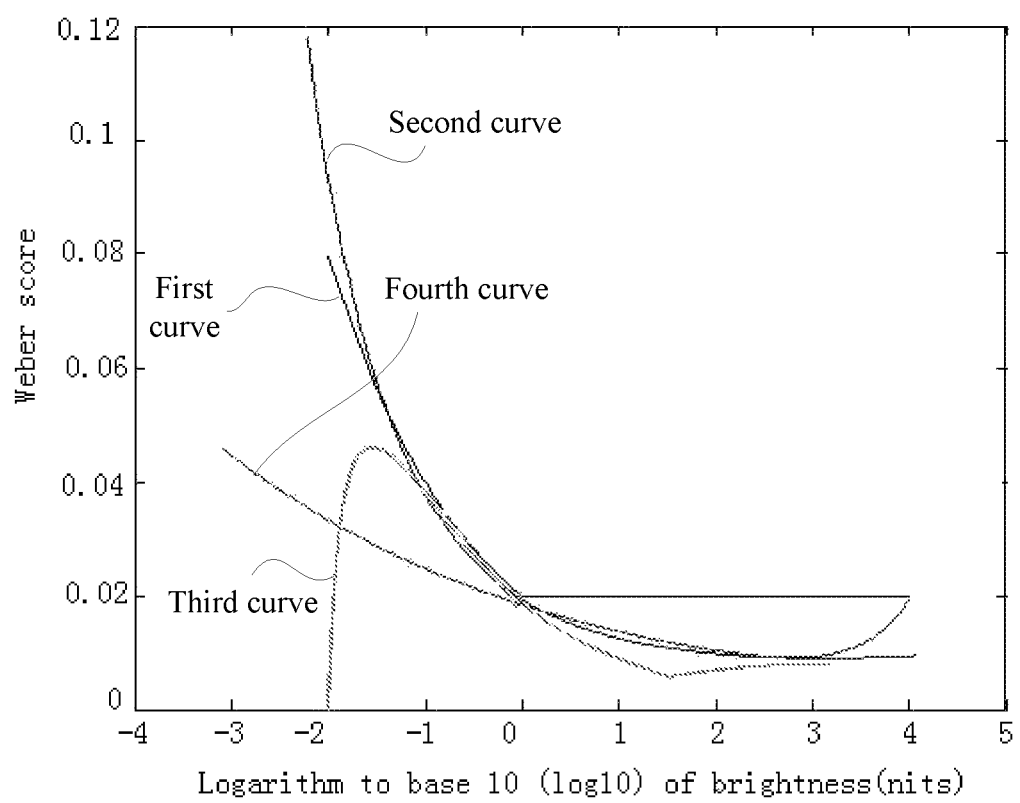
FIG. 1A is a schematic interface diagram of a Weber score according to an embodiment of the present disclosure.
Figure 1B:
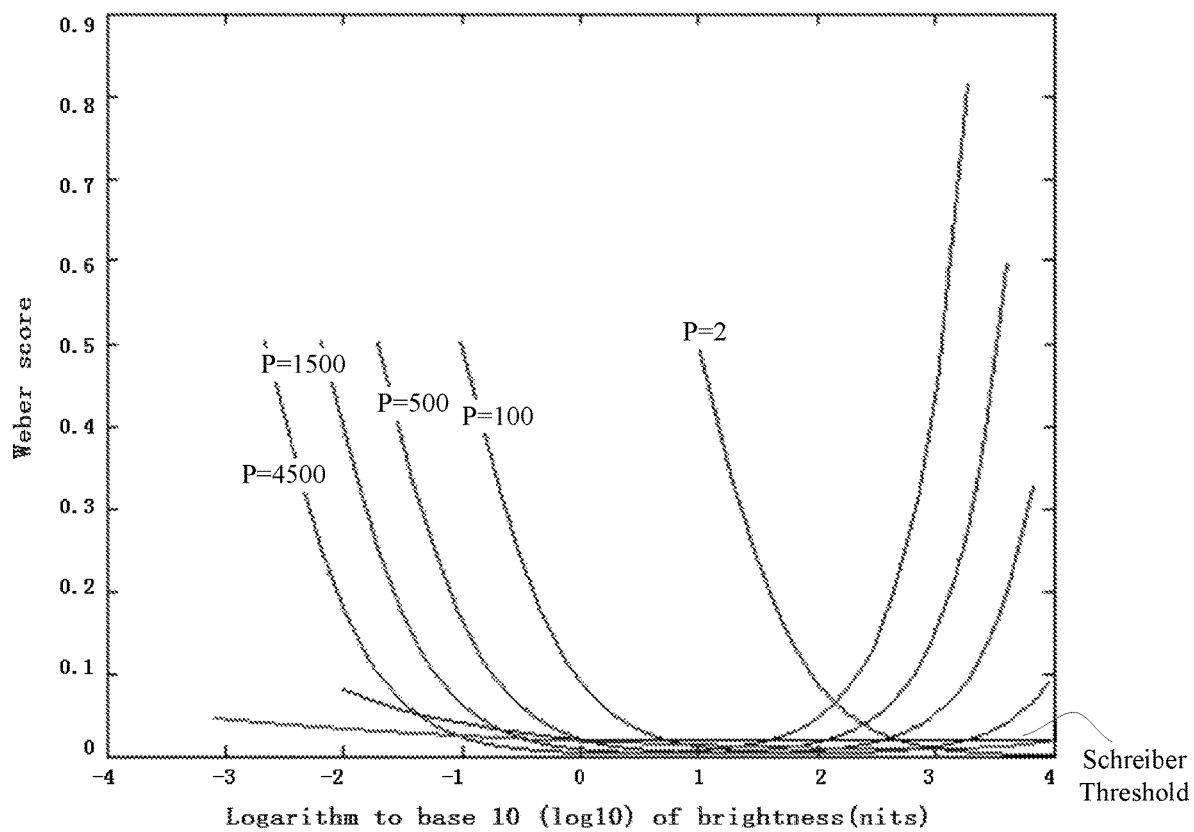
FIG. 1B is a schematic interface diagram of a quantization curve of a rational quantization function according to an embodiment of the present disclosure.
Figure 1C:
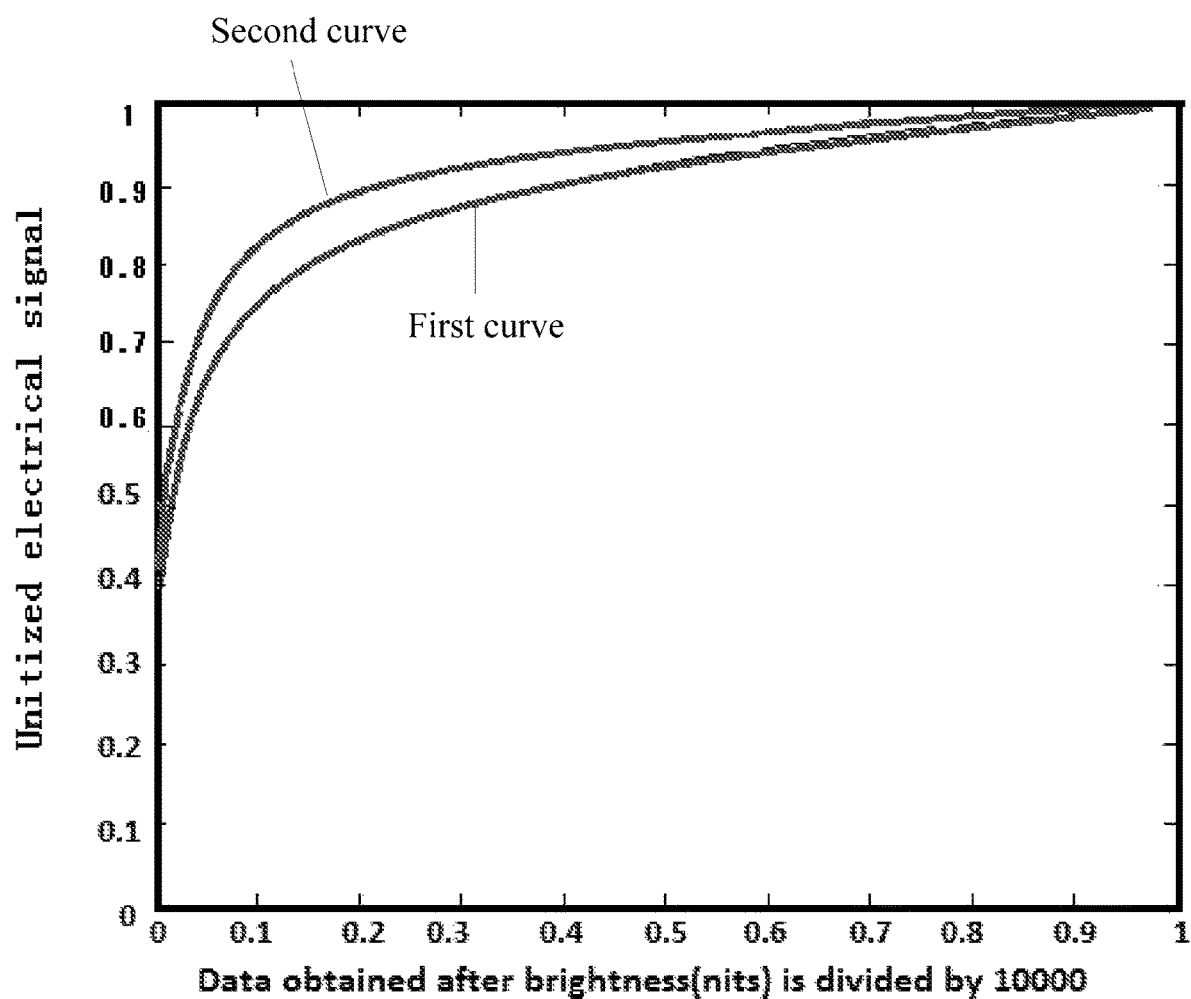
FIG. 1C is a schematic interface diagram of a brightness statistics curve according to an embodiment of the present disclosure.

A brightness statistics curve shown in FIG. 1C is used as an example. A first curve is a brightness statistics curve obtained based on scheme 1. A second curve is a brightness statistics curve obtained based on this application. The second curve rises faster than the first curve in a range of 0 nits to 1000 nits. This indicates that the second curve has a better stripe noise suppression capability in a low-brightness part.

An optical-electro transfer function in conventional scheme 2 uses the conventional Gamma function at a low end and a log curve at a high end. A Hybrid Log-Gamma transfer function is proposed. The Hybrid Log-Gamma function may be shown as follows:

$$E' = \begin{cases} r\sqrt{E} & 0 \le E \le 1 \\ a\ln(E-b)+c & 1 < E \end{cases},$$

where

E' represents image information generated after optical-electro transfer, E represents light information (normalized light information) of a real world, and a, b, c, and r are preset parameters. A dynamic range in scheme 2 is only between 0 nits and 2000 nits (excluding 2000 nits). A part exceeding 2000 nits is truncated to 2000 nits.

A Weber score shown in FIG. 1A is used as an example. A first curve is a Schreiber threshold in an ITU Report BT.2246 standard file. A second curve includes Weber scores obtained by using an optical-electro transfer function in scheme 1. A third curve includes Weber scores obtained by using the optical-electro transfer function in scheme 2. A fourth curve includes Weber scores obtained by using the optical-electro transfer function in this application. When a brightness value is less than 0.1 nits, the second curve does not meet the Schreiber threshold. A curve quantization range of the third curve is relatively narrow and is between 0.01 nits and 2000 nits. A quantization range of the fourth curve may reach 10000 nits, and therefore, the fourth curve better accords with a characteristic of human eye perception.

S202. The first terminal device transfers, from RGB space to YCbCr space by using a preset first color space transfer function, the image information generated after optical-electro transfer, to obtain image information generated after space transfer.

S203. The first terminal device performs, in the YCbCr space, floating-point-to-fixed-point conversion on the image information generated after space transfer, to obtain image information generated after floating-point-to-fixed-point conversion.

S204. The first terminal device performs downsampling on the image information generated after floating-point-to-fixed-point conversion, to obtain image information generated after downsampling.

S205. The first terminal device encodes the image information generated after downsampling, to obtain encoded image information.

S206. The first terminal device sends the encoded image information to a second terminal device.

S207. The second terminal device decodes the encoded image information, to obtain decoded image information.

S208. The second terminal device performs upsampling on the decoded image information, to obtain image information generated after upsampling.

S209. The second terminal device performs fixed-point-to-floating-point conversion on the image information generated after upsampling, to obtain image information generated after fixed-point-to-floating-point conversion.

S210. The second terminal device transfers, from the YCbCr space to the RGB space by using a preset second color space transfer function, the image information generated after fixed-point-to-floating-point conversion, to obtain image information generated after space transfer.

S211. The second terminal device performs, by using a preset electro-optical transfer function, electro-optical transfer on the image information generated after space transfer, to obtain an output primary color signal.

S212. The second terminal device outputs the primary color signal.

When a video stream encoding and decoding framework is SMPTE 2084 TF, an original optical-electro transfer module is updated to the optical-electro transfer function in this application. It can be learned through analysis that compared with an original video stream encoding and decoding method, the method for processing image signal conversion in this application saves a bit rate by 18.8% for a peak signal to noise ratio (PSNR), saves a bit rate by 20.3% for a masked peak signal to noise ratio (MPSNR), and saves a bit rate by 9% for Delta-E ($\Delta$E, a test unit of a color difference perceived by the human eye).

In the method for processing image signal conversion shown in FIG. 2A and FIG. 2B, the first terminal device performs optical-electro transfer on the input primary color signal by using the preset optical-electro transfer function, to obtain the image information generated after optical-electro transfer; transfers, from the RGB space to the YCbCr space by using the preset first color space transfer function, the image information generated after optical-electro transfer, to obtain the image information generated after space transfer; performs, in the YCbCr space, floating-point-to-fixed-point conversion on the image information generated after space transfer, to obtain the image information generated after floating-point-to-fixed-point conversion; performs downsampling on the image information generated after floating-point-to-fixed-point conversion, to obtain the image information generated after downsampling; encodes the image information generated after downsampling; and sends the encoded image information to the second terminal device. The second terminal device decodes the encoded image information, to obtain the decoded image information; performs upsampling on the decoded image information, to obtain the image information generated after upsampling; performs fixed-point-to-floating-point conversion on the image information generated after upsampling, to obtain the image information generated after fixed-point-to-floating-point conversion; transfers, from the YCbCr space to the RGB space by using the preset second color space transfer function, the image information generated after fixed-point-to-floating-point conversion, to obtain the image information generated after space transfer; performs, by using the preset electro-optical transfer function, electro-optical transfer on the image information generated after space transfer, to obtain the output primary color signal; and outputs the primary color signal. In this way, quantization quality can be improved, and resource utilization can be also improved.

Figure 3:
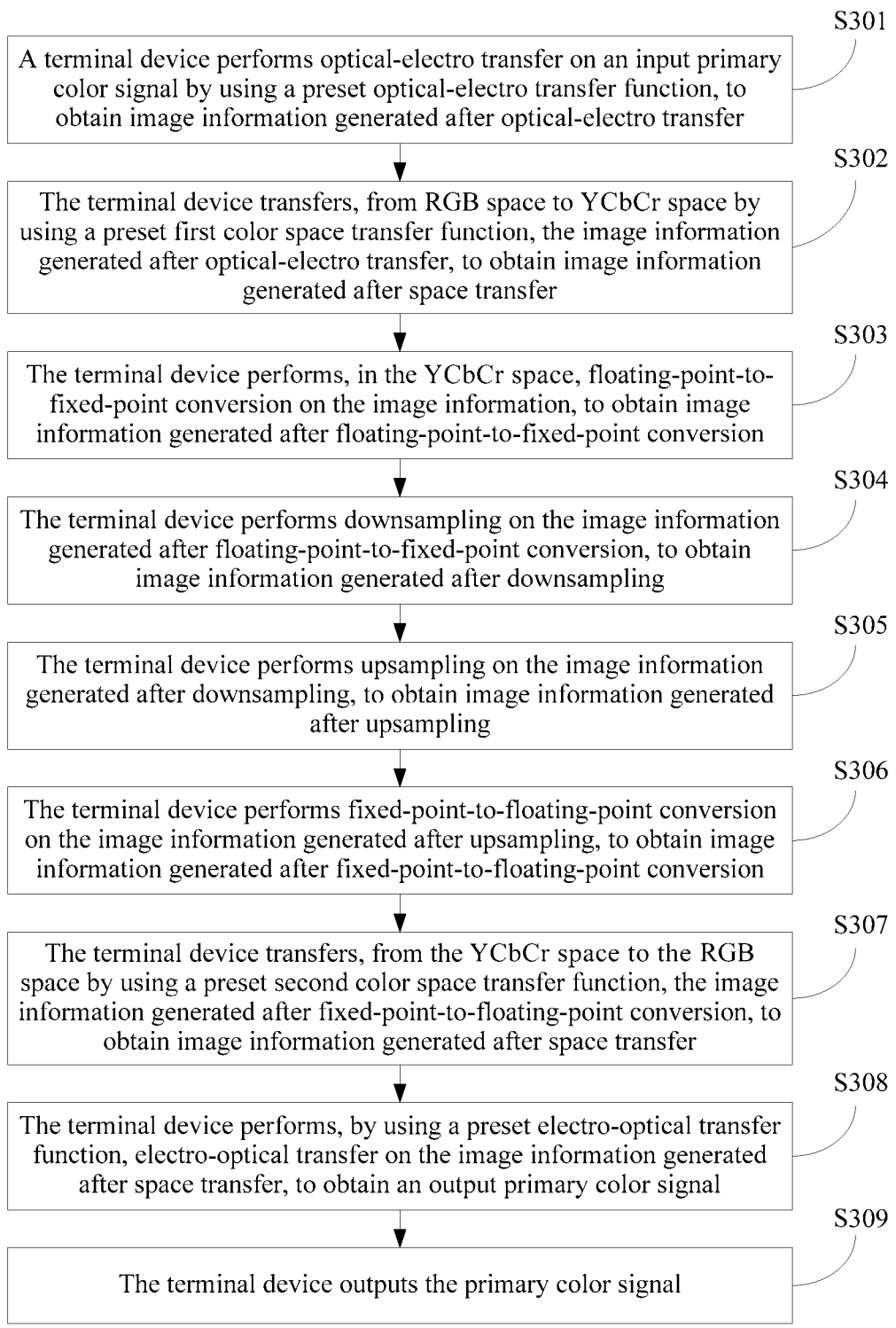
FIG. 3 is a schematic flowchart of a method for processing image signal conversion according to another embodiment of the present disclosure.

Referring to FIG. 3, FIG. 3 is a schematic flowchart of a method for processing image signal conversion according to another embodiment of the present disclosure. As shown in the figure, the method for processing image signal conversion in this embodiment of the present disclosure may include at least the following steps.

S301. A terminal device performs optical-electro transfer on an input primary color signal by using a preset optical-electro transfer function, to obtain image information generated after optical-electro transfer.

The terminal device may perform optical-electro transfer on the input primary color signal by using the preset optical-electro transfer function, to obtain the image information generated after optical-electro transfer. The terminal device may be a smartphone, a camera, a tablet computer, or the like. An image composed of the primary color signal may be collected by the camera or stored locally in advance.

S302. The terminal device transfers, from RGB space to YCbCr space by using a preset first color space transfer function, the image information generated after optical-electro transfer, to obtain image information generated after space transfer.

S303. The terminal device performs, in the YCbCr space, floating-point-to-fixed-point conversion on the image information, to obtain image information generated after floating-point-to-fixed-point conversion.

S304. The terminal device performs downsampling on the image information generated after floating-point-to-fixed-point conversion, to obtain image information generated after downsampling.

S305. The terminal device performs upsampling on the image information generated after downsampling, to obtain image information generated after upsampling.

S306. The terminal device performs fixed-point-to-floating-point conversion on the image information generated after upsampling, to obtain image information generated after fixed-point-to-floating-point conversion.

S307. The terminal device transfers, from the YCbCr space to the RGB space by using a preset second color space transfer function, the image information generated after fixed-point-to-floating-point conversion, to obtain image information generated after space transfer.

S308. The terminal device performs, by using a preset electro-optical transfer function, electro-optical transfer on the image information generated after space transfer, to obtain an output primary color signal.

S309. The terminal device outputs the primary color signal.

In the method for processing image signal conversion shown in FIG. 3, the terminal device performs optical-electro transfer on the input primary color signal by using the preset optical-electro transfer function, to obtain the image information generated after optical-electro transfer; transfers, from the RGB space to the YCbCr space by using the preset first color space transfer function, the image information generated after optical-electro transfer, to obtain the image information generated after space transfer; performs, in the YCbCr space, floating-point-to-fixed-point conversion on the image information generated after space transfer, to obtain the image information generated after floating-point-to-fixed-point conversion; performs downsampling on the image information generated after floating-point-to-fixed-point conversion, to obtain the image information generated after downsampling; performs upsampling on the image information generated after downsampling, to obtain the image information generated after upsampling; performs fixed-point-to-floating-point conversion on the image information generated after upsampling, to obtain the image information generated after fixed-point-to-floating-point conversion; transfers, from the YCbCr space to the RGB space by using the preset second color space transfer function, the image information generated after fixed-point-to-floating-point conversion, to obtain the image information generated after space transfer; performs, by using the preset electro-optical transfer function, electro-optical transfer on the image information generated after space transfer, to obtain the output primary color signal; and outputs the primary color signal. In this way, quantization quality can be improved, and resource utilization can be also improved.

Figure 4:
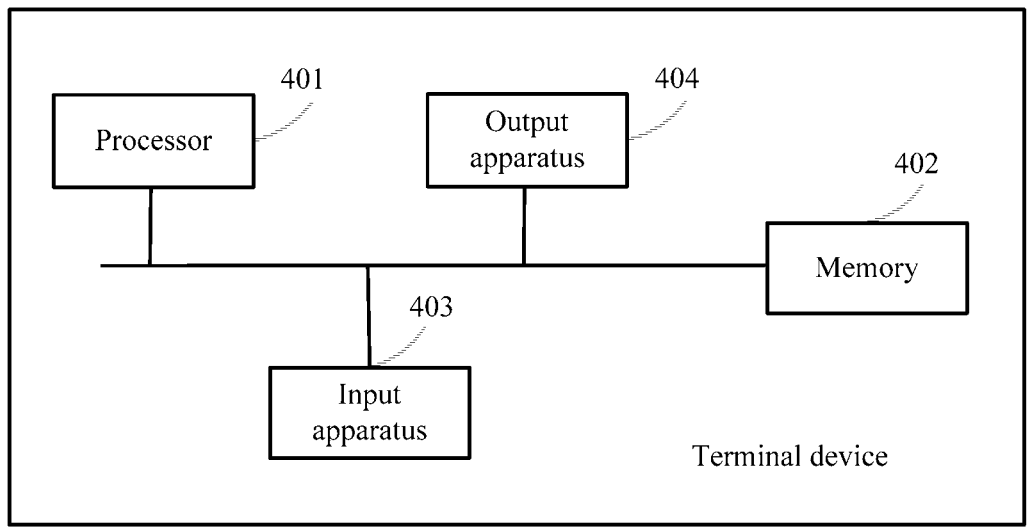
FIG. 4 is a schematic structural diagram of a terminal device according to an embodiment of the present disclosure.

Referring to FIG. 4, FIG. 4 is a schematic structural diagram of a terminal device according to an embodiment of the present disclosure. As shown in FIG. 4, the terminal device may include a processor 401, a memory 402, an input apparatus 403, and an output apparatus 404. The processor 401 is connected to the memory 402, the input apparatus 403, and the output apparatus 404. For example, the processor 401 may be connected to the memory 402, the input apparatus 403, and the output apparatus 404 by using a bus.

The processor 401 may be a central processing unit (CPU), a network processor (NP), or the like.

The memory 402 may be specifically configured to store a primary color signal and the like. The memory 402 may include a volatile memory, for example, a random access memory (RAM); or the memory may include a nonvolatile memory, for example, a read-only memory (ROM), a flash memory, a hard disk drive (HDD), or a solid-state drive (SSD); or the memory may include a combination of the memories of the foregoing types.

The input apparatus 403 is configured to receive an input primary color signal. For example, the input apparatus 403 is a wireless interface or a wired interface.

The output apparatus 404 is configured to output a primary color signal. For example, the output apparatus 404 is a wireless interface or a wired interface.

The processor 401, the input apparatus 403, and the output apparatus 404 invoke a program stored in the memory 402, and may perform the following operations:

the input apparatus 403 is configured to obtain the input primary color signal, where the primary color signal is a numeric value of an optical signal corresponding to an image, and the primary color signal is proportional to light intensity;

the processor 401 is configured to perform, by using a preset optical-electro transfer function, optical-electro transfer on the input primary color signal, to obtain image information generated after optical-electro transfer, where the image information is a numeric expression value of the image, and the conversion processing includes at least the following processing:

$$L' = a\left(\frac{pL}{(p-1)L+1}\right)^m + b,$$

where a, b, m, and p are rational numbers, L is the input primary color signal, and L' is the image information generated after conversion processing;

the processor 401 is further configured to transfer, from RGB space to YCbCr space by using a preset color space transfer function, the image information generated after optical-electro transfer, to obtain image information generated after space transfer;

the processor 401 is further configured to perform, in the YCbCr space, floating-point-to-fixed-point conversion on the image information, to obtain image information generated after floating-point-to-fixed-point conversion;

the processor 401 is further configured to perform downsampling on the image information generated after floating-point-to-fixed-point conversion, to obtain image information generated after downsampling;

the processor 401 is further configured to perform upsampling on the image information generated after downsampling, to obtain image information generated after upsampling;

the processor 401 is further configured to perform fixed-point-to-floating-point conversion on the image information generated after upsampling, to obtain image information generated after fixed-point-to-floating-point conversion;

the processor 401 is further configured to transfer, from the YCbCr space to the RGB space by using a preset color space transfer function, the image information generated after fixed-point-to-floating-point conversion, to obtain image information generated after space transfer;

the processor 401 is further configured to perform, by using a preset electro-optical transfer function, electro-optical transfer on the image information generated after color space transfer, to obtain an output primary color signal, where the output primary color signal is a value used by a display device to display a reference optical signal of the image, and the primary color signal is proportional to light intensity; and the conversion processing includes:

$$L = \frac{1}{p\left(\frac{L'-b}{a}\right)^{-\frac{1}{m}} - p + 1},$$

where a, b, m, and p are rational numbers, L' is input image information, and L is the processed output primary color signal; and the output apparatus 404 is configured to output the primary color signal.

Specifically, the terminal device described in this embodiment of the present disclosure may be configured to implement some or all of the processes in the embodiment that is of the method for processing image signal conversion and that is described with reference to FIG. 2A and FIG. 2B or FIG. 3 in the present disclosure.

Figure 5:
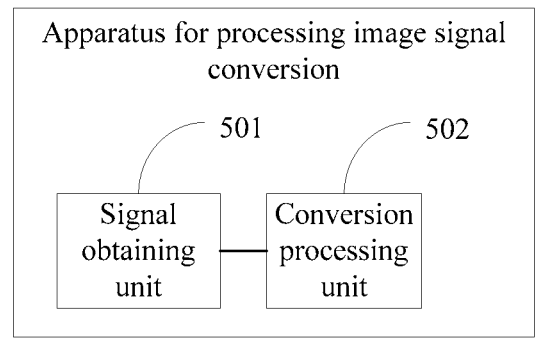
FIG. 5 is a schematic structural diagram of an apparatus for processing image signal conversion according to an embodiment of the present disclosure.

Referring to FIG. 5, FIG. 5 is a schematic structural diagram of an apparatus for processing image signal conversion according to an embodiment of the present disclosure. The apparatus for processing image signal conversion in this embodiment of the present disclosure may be configured to implement some or all of the processes in the embodiment that is of the method for processing image signal conversion and that is described with reference to FIG. 2A and FIG. 2B or FIG. 3 in the present disclosure. As shown in the figure, the apparatus for processing image signal conversion in this embodiment of the present disclosure may include at least a signal obtaining unit 501 and a conversion processing unit 502.

The signal obtaining unit 501 is configured to obtain an input primary color signal, where the primary color signal is a numeric value of an optical signal corresponding to an image, and the primary color signal is proportional to light intensity.

The conversion processing unit 502 is configured to perform, by using an optical-electro transfer function, conversion processing on the primary color signal, to obtain processed image information, where the image information is a numeric expression value of the image, and the conversion processing includes at least the following processing:

$$L' = a\left(\frac{pL}{(p-1)L+1}\right)^m + b,$$

where a, b, m, and p are rational numbers, L is the input primary color signal, and L' is the image information generated after conversion processing.

In an optional embodiment, the conversion processing includes at least a scaling parameter a and a bias parameter b, and the scaling parameter and the bias parameter are used to control a shape of a conversion characteristic curve of the conversion processing.

In an optional embodiment, the conversion processing includes at least a scaling parameter a and a bias parameter b, and the scaling parameter a and the bias parameter b meet: a+b=1.

In an optional embodiment, the conversion processing is:

$$L' = a\left(\left(\frac{pL}{(p-1)L+1}\right)^m - 1\right) + 1,$$

where a, m, and p are rational numbers, L is the input primary color signal, and L' is the image information generated after conversion processing.

In an optional embodiment, that a, b, m, and p are rational numbers includes:
 a=1.12672, b=−0.12672, m=0.14, and p=2.2; or
 a=1.19996, b=−0.19996, m=0.11, and p=1.1; or
 a=1.17053, b=−0.17053, m=0.12, and p=1.4; or
 a=1.14698, b=−0.14698, m=0.13, and p=1.8; or
 a=1.11007, b=−0.11007, m=0.15, and p=2.7; or
 a=1.12762, b=−0.127622, m=0.14, and p=2.3; or
 a=1.13014, b=−0.13014, m=0.14, and p=2.6; or
 a=1.11204, b=−0.112042, m=0.15, and p=3; or
 a=1.09615, b=−0.0961462, m=0.16, and p=3.3.

In an optional embodiment, that a, b, m, and p are rational numbers includes:
 a=1.2441, b=−0.2441, m=0.1, and p=1.1; or
 a=1.20228, b=−0.20228, m=0.11, and p=1.2; or
 a=1.17529, b=−0.17529, m=0.12, and p=1.7; or
 a=1.14933, b=−0.14933, m=0.13, and p=2; or
 a=1.12762, b=−0.12762, m=0.14, and p=2.3; or
 a=1.11204, b=−0.11204, m=0.15, and p=3; or
 a=1.09615, b=−0.09615, m=0.16, and p=3.3.

In an optional embodiment, the primary color signal is a numeric value of a color component corresponding to specific color space.

In an optional embodiment, the primary color signal is a color component corresponding to specific color space, including at least an R component, a G component, a B component, or a Y component.

In an optional embodiment, the primary color signal is a numeric value of a color component corresponding to specific color space, and the numeric value is expressed in a floating-point number, a half-precision floating-point number, or a fixed-point number. The half-precision floating-point number, for example, is a 16-bit floating-point number, or a half-precision floating-point number defined in IEEE 754.

In an optional embodiment, the conversion processing is computation performed in normalized space [0,1].

In an optional embodiment, the primary color signal is a numeric value of an optical signal corresponding to a photographing scene in a camera, and the image information is a linear numeric expression value used for recording an original optical signal of a scene image in the camera; or the primary color signal is a linear numeric expression value of an original optical signal of the image, and the image information is a non-linear numeric expression value of an image generated after conversion processing; or the primary color signal is a first non-linear numeric expression value of the image, and the image information is a second non-linear numeric expression value of an image generated after conversion processing.

In the apparatus for processing image signal conversion shown in FIG. 5, the signal obtaining unit 501 obtains the input primary color signal, where the primary color signal is the numeric value of the optical signal corresponding to the image, and the primary color signal is proportional to the light intensity; and the conversion processing unit 502 performs conversion processing on the primary color signal by using the optical-electro transfer function, to obtain the processed image information, where the image information is the numeric expression value of the image. In this way, quantization quality can be improved.

Figure 6:
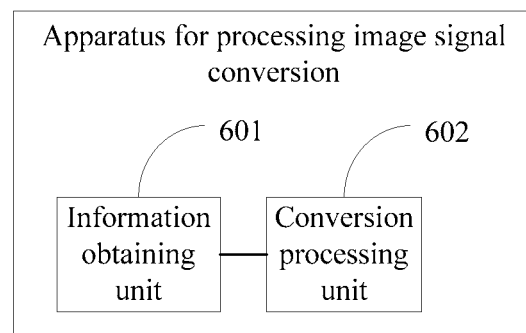
FIG. 6 is a schematic structural diagram of an apparatus for processing image signal conversion according to another embodiment of the present disclosure.

Referring to FIG. 6, FIG. 6 is a schematic structural diagram of an apparatus for processing image signal conversion according to another embodiment of the present disclosure. The apparatus for processing image signal conversion in this embodiment of the present disclosure may be configured to implement some or all of the processes in the embodiment that is of the method for processing image signal conversion and that is described with reference to FIG. 2A and FIG. 2B or FIG. 3 in the present disclosure. As shown in the figure, the apparatus for processing image signal conversion in this embodiment of the present disclosure may include at least an information obtaining unit 601 and a conversion processing unit 602.

The information obtaining unit 601 is configured to obtain input image information, where the image information is a numeric expression value of an image.

The conversion processing unit 602 is configured to perform, by using an electro-optical transfer function, conversion processing on the image information, to obtain an output primary color signal, where the primary color signal is a value used by a display device to display a reference optical signal of the image, and the primary color signal is proportional to light intensity; and the conversion processing includes:

$$L = \frac{1}{p\left(\frac{L'-b}{a}\right)^{-\frac{1}{m}} - p + 1},$$

where a, b, m, and p are rational numbers, L' is the input image information, and L is the processed output primary color signal.

In an optional embodiment, the conversion processing includes at least a scaling parameter a and a bias parameter b, and the scaling parameter and the bias parameter are used to control a shape of a conversion characteristic curve of the conversion processing.

In an optional embodiment, the conversion processing includes at least a scaling parameter a and a bias parameter b, and the scaling parameter a and the bias parameter b meet: a+b=1.

In an optional embodiment, the conversion processing is:

$$L = \frac{1}{p\left(\frac{L'-1}{a}+1\right)^{-\frac{1}{m}} - p + 1},$$

where a, m, and p are rational numbers, L' is the input image information, and L is the processed output primary color signal.

In an optional embodiment, that a, b, m, and p are rational numbers includes:
    a=1.12672, b=−0.12672, m=0.14, and p=2.2; or
    a=1.19996, b=−0.19996, m=0.11, and p=1.1; or
    a=1.17053, b=−0.17053, m=0.12, and p=1.4; or
    a=1.14698, b=−0.14698, m=0.13, and p=1.8; or
    a=1.11007, b=−0.11007, m=0.15, and p=2.7; or
    a=1.12762, b=−0.127622, m=0.14, and p=2.3; or
    a=1.13014, b=−0.13014, m=0.14, and p=2.6; or
    a=1.11204, b=−0.112042, m=0.15, and p=3; or
    a=1.09615, b=−0.0961462, m=0.16, and p=3.3.

In an optional embodiment, that a, b, m, and p are rational numbers includes:
    a=1.2441, b=−0.2441, m=0.1, and p=1.1; or
    a=1.20228, b=−0.20228, m=0.11, and p=1.2; or
    a=1.17529, b=−0.17529, m=0.12, and p=1.7; or
    a=1.14933, b=−0.14933, m=0.13, and p=2; or
    a=1.12762, b=−0.12762, m=0.14, and p=2.3; or
    a=1.11204, b=−0.11204, m=0.15, and p=3; or
    a=1.09615, b=−0.09615, m=0.16, and p=3.3.

In an optional embodiment, the primary color signal is a numeric value of a color component corresponding to specific color space.

In an optional embodiment, a color component, of the primary color signal, corresponding to specific color space includes at least an R component, a G component, a B component, or a Y component.

In an optional embodiment, the processed output primary color signal is a numeric value of a color component corresponding to specific color space, and the numeric value is expressed in a floating-point number, a half-precision floating-point number, or a fixed-point number. The half-precision floating-point number, for example, is a 16-bit floating-point number, or a half-precision floating-point number defined in IEEE 754.

In an optional embodiment, the conversion processing is computation performed in normalized space [0,1].

In an optional embodiment, the image information is a non-linear numeric expression value that is used to display the image and that is input to a display terminal device, and the primary color signal is a numeric value of a corresponding optical signal in the display terminal device; or the image information is a non-linear numeric expression value of the input image, and the primary color signal is a linear numeric expression value; or the image information is a first non-linear numeric expression value of an image generated after conversion processing, and the primary color signal is a second non-linear numeric expression value of the image.

In the apparatus for processing image signal conversion shown in FIG. 6, the information obtaining unit 601 obtains the input image information, where the image information is the numeric expression value of the image; and the conversion processing unit 602 performs conversion processing on the image information by using the electro-optical transfer function, to obtain the output primary color signal, where the primary color signal is the value used by the display device to display the reference optical signal of the image, and the primary color signal is proportional to the light intensity. In this way, quantization quality can be improved.

In descriptions in this specification, descriptions about such reference terms as "an embodiment", "some embodiments", "an example", "a specific example", and "some examples" mean that specific features, structures, materials, or characteristics described with reference to the embodiments or examples are included in at least one embodiment or example of the present disclosure. In the specification, the foregoing example expressions of the terms are not necessarily with respect to a same embodiment or example. In addition, the described specific features, structures, materials, or characteristics may be combined in a proper manner in any one or more of the embodiments or examples. In addition, a person skilled in the art may integrate or combine different embodiments or examples and characteristics of different embodiments or examples described in this specification, as long as they do not conflict with each other.

In addition, the terms "first" and "second" are merely intended for a purpose of description, and shall not be understood as an indication or implication of relative importance or an implicit indication of a quantity of indicated technical features. Therefore, a feature limited by "first" or "second" may explicitly or implicitly include at least one of the features. In the descriptions about the present disclosure, "a plurality of" means at least two, for example, two or three, unless otherwise specifically limited.

Logic and/or steps shown in the flowcharts or described herein in other manners, for example, may be considered as a program list of executable instructions that are used to implement logical functions, and may be specifically implemented on any computer-readable medium, for an instruction execution system, apparatus, or device (for example, a computer-based system, a system including a processor, or another system that can fetch instructions from the instruction execution system, apparatus, or device and execute the instructions) to use, or for a combination of the instruction execution system, apparatus, or device to use. In terms of this specification, the "computer-readable medium" may be any apparatus that may include, store, communicate, propagate, or transmit programs, for the instruction execution system, apparatus, or device to use, or for a combination of the instruction execution system, apparatus, or device to use. More specific examples (this list is not exhaustive) of the computer-readable medium include the following: an electrical connection part (an electronic apparatus) with one or more buses, a portable computer cartridge (a magnetic apparatus), a random access memory, a read-only memory, an erasable programmable read-only memory, an optical fiber apparatus, and a portable compact disc read-only memory. In addition, the computer-readable medium may even be a piece of paper on which the programs can be printed or another appropriate medium. Because, for example, optical scanning may be performed on the paper or the another medium, then processing, such as edition, decoding, or another appropriate means when necessary, may be performed to obtain the programs in an electronic manner, and then the programs are stored in a computer memory.

It should be understood that parts in the present disclosure may be implemented by using hardware, software, firmware, or a combination thereof. In the foregoing implementations, a plurality of steps or methods may be implemented by using software or firmware that is stored in a memory and is executed by an appropriate instruction execution system. For example, if hardware is used for implementation, being similar to implementation in another implementation, any item or a combination of the following well-known technologies in the art may be used for implementation: a discrete logic circuit having a logic gate circuit that is configured to implement a logical function for a data signal, an application-specific integrated circuit having an appropriate combinatorial logic gate circuit, a programmable gate array, a field programmable gate array, and the like.

In addition, the modules in the embodiments of the present disclosure may be implemented in a form of hardware, or may be implemented in a form of a software functional module. If an integrated module is implemented in the form of a software functional module and sold or used as an independent product, the integrated module may be stored in a computer-readable storage medium.

Although the embodiments of the present disclosure are shown and described above, it can be understood that the foregoing embodiments are examples, and cannot be construed as a limitation to the present disclosure. Within the scope of the present disclosure, a person of ordinary skill in the art may make changes, modifications, replacement, and variations to the foregoing embodiments.

What is claimed is:

1. A method for processing image signal conversion, wherein the method comprises:
    obtaining an input primary color signal, wherein the input primary color signal is a numeric value of an optical signal corresponding to an image, and the input primary color signal is proportional to light intensity; and
    obtaining processed image information by performing conversion processing on the input primary color signal, wherein the processed image information is a numeric expression value of the image, and the conversion processing comprises at least the following processing:

$$L' = a\left(\frac{pL}{(p-1)L+1}\right)^m + b,$$

wherein a is a positive rational number, b is a negative rational number, m and p are rational numbers and p is not equal to zero, L is the input primary color signal, and L' is the processed image information.

2. The method according to claim 1, wherein the conversion processing comprises at least a scaling parameter a and a bias parameter b, and the scaling parameter and the bias parameter are used to control a shape of a conversion characteristic curve of the conversion processing.

3. The method according to claim 1, wherein the conversion processing comprises at least a scaling parameter a and a bias parameter b, and a+b=1.

4. The method according to claim 3, wherein the conversion processing is:

$$L' = a\left(\left(\frac{pL}{(p-1)L+1}\right)^m - 1\right) + 1.$$

5. The method according to claim 1, wherein that a, b, m, and p are rational numbers comprises one of:
    a=1.12672, b=−0.12672, m=0.14, and p=2.2;
    a=1.19996, b=−0.19996, m=0.11, and p=1.1;
    a=1.17053, b=−0.17053, m=0.12, and p=1.4;
    a=1.14698, b=−0.14698, m=0.13, and p=1.8;
    a=1.11007, b=−0.11007, m=0.15, and p=2.7;
    a=1.12762, b=−0.127622, m=0.14, and p=2.3;
    a=1.13014, b=−0.13014, m=0.14, and p=2.6;
    a=1.11204, b=−0.112042, m=0.15, and p=3; and
    a=1.09615, b=−0.0961462, m=0.16, and p=3.3.

6. The method according to claim 1, wherein that a, b, m, and p are rational numbers comprises one of:
    a=1.2441, b=−0.2441, m=0.1, and p=1.1;
    a=1.20228, b=−0.20228, m=0.11, and p=1.2;
    a=1.17529, b=−0.17529, m=0.12, and p=1.7;
    a=1.14933, b=−0.14933, m=0.13, and p=2;
    a=1.12762, b=−0.12762, m=0.14, and p=2.3;
    a=1.11204, b=−0.11204, m=0.15, and p=3; and
    a=1.09615, b=−0.09615, m=0.16, and p=3.3.

7. The method according to claim 1, wherein the input primary color signal is a numeric value of a color component corresponding to specific color space.

8. The method according to claim 1, wherein the input primary color signal is a color component corresponding to specific color space, the color component comprising at least one of an R component, a G component, a B component, and a Y component.

9. The method according to claim 1, wherein the input primary color signal is a numeric value of a color component corresponding to specific color space, and the numeric value is expressed in a floating-point number, a half-precision floating-point number, or a fixed-point number.

10. The method according to claim 1, wherein the conversion processing is computation performed in normalized space [0,1].

11. The method according to claim 1, wherein at least one of the following:
the input primary color signal is a numeric value of an optical signal corresponding to a photographing scene in a camera, and the image information is a linear numeric expression value used for recording an original optical signal of a scene image in the camera;
the input primary color signal is a linear numeric expression value of an original optical signal of the image, and the image information is a non-linear numeric expression value of an image generated after conversion processing; and
the input primary color signal is a first non-linear numeric expression value of the image, and the image information is a second non-linear numeric expression value of an image generated after conversion processing.

12. A method for processing image signal conversion, wherein the method comprises:
obtaining input image information, wherein the input image information is a numeric expression value of an image; and
performing conversion processing on the input image information to obtain an output primary color signal, wherein the output primary color signal is a value used by a display device to display a reference optical signal of the image, and the output primary color signal is proportional to light intensity; and
the conversion processing comprises:

$$L = \frac{1}{p\left(\frac{L'-b}{a}\right)^{-\frac{1}{m}} - p + 1},$$

wherein a, b, m, and p are rational numbers, L' is the input image information, and L is the output primary color signal.

13. The method according to claim 12, wherein the conversion processing comprises at least a scaling parameter a and a bias parameter b, and the scaling parameter and the bias parameter are used to control a shape of a conversion characteristic curve of the conversion processing.

14. The method according to claim 12, wherein the conversion processing comprises at least a scaling parameter a and a bias parameter b, and a+b=1.

15. The method according to claim 14, wherein the conversion processing is:

$$L = \frac{1}{p\left(\frac{L'-1}{a}+1\right)^{-\frac{1}{m}} - p + 1}.$$

16. The method according to claim 12, wherein that a, b, m, and p are rational numbers comprises one of:

a=1.12672, b=−0.12672, m=0.14, and p=2.2;
a=1.19996, b=−0.19996, m=0.11, and p=1.1;
a=1.17053, b=−0.17053, m=0.12, and p=1.4;
a=1.14698, b=−0.14698, m=0.13, and p=1.8;
a=1.11007, b=−0.11007, m=0.15, and p=2.7;
a=1.12762, b=−0.127622, m=0.14, and p=2.3;
a=1.13014, b=−0.13014, m=0.14, and p=2.6;
a=1.11204, b=−0.112042, m=0.15, and p=3; and
a=1.09615, b=−0.0961462, m=0.16, and p=3.3.

17. The method according to claim 12, wherein that a, b, m, and p are rational numbers comprises one of:
a=1.2441, b=−0.2441, m=0.1, and p=1.1;
a=1.20228, b=−0.20228, m=0.11, and p=1.2;
a=1.17529, b=−0.17529, m=0.12, and p=1.7;
a=1.14933, b=−0.14933, m=0.13, and p=2;
a=1.12762, b=−0.12762, m=0.14, and p=2.3;
a=1.11204, b=−0.11204, m=0.15, and p=3; and
a=1.09615, b=−0.09615, m=0.16, and p=3.3.

18. The method according to claim 12, wherein the output primary color signal is a numeric value of a color component corresponding to specific color space.

19. The method according to claim 12, wherein a color component, of the output primary color signal, corresponding to specific color space comprises at least one of an R component, a G component, a B component, and a Y component.

20. The method according to claim 12, wherein the output primary color signal is a numeric value of a color component corresponding to specific color space, and the numeric value is expressed in a floating-point number, a half-precision floating-point number, or a fixed-point number.

21. The method according to claim 12, wherein the conversion processing is computation performed in normalized space [0,1].

22. The method according to claim 12, wherein at least one of the following:
the image information is a non-linear numeric expression value that is used to display the image and that is input to a display terminal device, and the output primary color signal is a numeric value of a corresponding optical signal in the display terminal device;
the image information is a non-linear numeric expression value of the input image, and the output primary color signal is a linear numeric expression value; and
the image information is a first non-linear numeric expression value of an image generated after conversion processing, and the output primary color signal is a second non-linear numeric expression value of the image.

23. An apparatus for processing image signal conversion, wherein the apparatus comprises:
a receiver, the receiver configured to obtain an input primary color signal, wherein the input primary color signal is a numeric value of an optical signal corresponding to an image, and the input primary color signal is proportional to light intensity; and
at least one processor, the at least one processor configured to obtain processed image information by performing conversion processing on the input primary color signal, wherein the processed image information is a numeric expression value of the image, and the conversion processing comprises at least the following processing:

$$L' = a\left(\frac{pL}{(p-1)L+1}\right)^m + b,$$

wherein a is a positive rational number, b is a negative rational number, m and p are rational numbers and p is not equal to zero, L is the input primary color signal, and L' is the processed image information.

24. An apparatus for processing image signal conversion, wherein the apparatus comprises:
   a receiver, the receiver configured to obtain input image information, wherein the input image information is a numeric expression value of an image; and
   at least one processor, the at least one processor configured to perform conversion processing on the input image information to obtain an output primary color signal, wherein the output primary color signal is a value used by a display device to display a reference optical signal of the image, the output primary color signal is proportional to light intensity, and the conversion processing comprises:

$$L = \frac{1}{p\left(\frac{L'-b}{a}\right)^{-\frac{1}{m}} - p + 1},$$

wherein a, b, m, and p are rational numbers, L' is the input image information, and L is the output primary color signal.

* * * * *